(12) United States Patent
Mizuno et al.

(10) Patent No.: US 6,285,626 B2
(45) Date of Patent: Sep. 4, 2001

(54) SEMICONDUCTOR DEVICE

(75) Inventors: Hiroyuki Mizuno, Kokubunji; Yusuke Kanno, Hachioji; Takao Watanabe, Fuchu, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/730,785

(22) Filed: Dec. 7, 2000

(30) Foreign Application Priority Data

Dec. 8, 1999 (JP) ................................................. 11-348405

(51) Int. Cl.[7] ........................................................ G11C 8/00
(52) U.S. Cl. ............................................. 365/233; 365/222
(58) Field of Search ..................................... 365/233, 222, 365/189.05, 230.08

(56) References Cited

U.S. PATENT DOCUMENTS

| | | | |
|---|---|---|---|
| 5,999,474 | 12/1999 | Leung et al. ........................... | 365/222 |
| 6,094,704 | * 7/2000 | Martin et al. .......................... | 365/233 |
| 6,108,244 | * 8/2000 | Lee et al. .......................... | 365/189.05 |
| 6,130,856 | * 10/2000 | McLaury ................................. | 365/233 |
| 6,198,689 | * 3/2001 | Yamazaki et al. .................... | 365/233 |

FOREIGN PATENT DOCUMENTS 61-71494    4/1986   (JP) .

OTHER PUBLICATIONS

Itoh, Kiyoo, "Ultra LSI Memory", pp. 12–15, 86–87, 90–91, and 164–167 (Baifukan, 1994).

Regitz et al. "A Three–Transistor–Cell, 1024–Bit, 500 NS MOS RAM" IEEE International Solid–State Circuits Conference Digest of Technical Papers, pp. 42–43, Feb., 1970.

* cited by examiner

Primary Examiner—Trong Phan
(74) Attorney, Agent, or Firm—Miles & Stockbridge

(57) ABSTRACT

A dynamic memory requires refreshing to retain data in its memory cells. This may cause access to the dynamic memory for purposes other than refreshing (external access) and access to it for refreshing to compete with each other, resulting in a performance deterioration. According to this invention, a pipelined dynamic memory (PDRAM) is used, and the pipeline frequency (CLK) of the pipelined dynamic memory is made higher than the frequency (CLK1) of external access, and access required for refreshing is made to an unoccupied slot (a timing when any external access request is never issued) in the pipeline of the pipelined dynamic memory. This makes refreshing of the internal dynamic memory an internal operation, which eliminates the need to take refreshing into consideration at the time external access is made, leading to improvement in operating ease and speed.

18 Claims, 16 Drawing Sheets

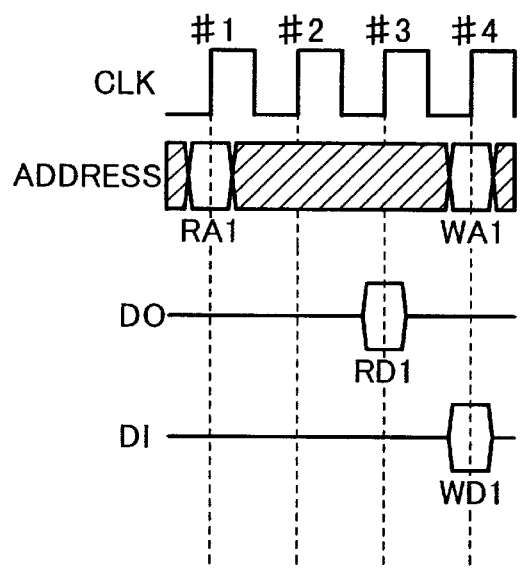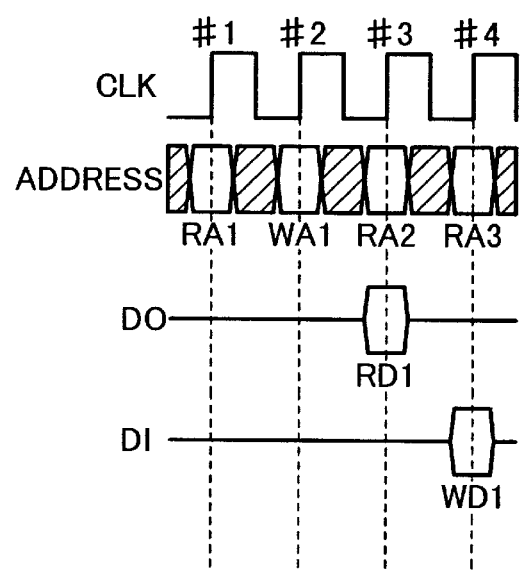

SEMICONDUCTOR DEVICE

FIELD OF THE INVENTION

The present invention relates to a dynamic memory and a semiconductor device which uses it, particularly to a dynamic memory suitable for high speed applications with low power consumption and a semiconductor device which uses it.

BACKGROUND OF THE INVENTION

The operating waveforms of a conventional dynamic memory (hereinafter called DRAM) which stores data in its memory cells each consisting of one n-MOS transistor and one capacitor are as shown in FIG. 2, for example, according to the book about "VLSI memories" authored by Kiyoo Itoh (published by Baifukan 1994, p.86). Here, in reading, after word line WL is asserted to read the signal from a memory cell to the bit line BL, /BL, the sense amplifier is activated at a prescribed timing $\phi A$ to amplify the signal on the bit line. As a result, when a row address access time (tRAC) has elapsed after the start of the access, final output of data occurs. A time for rewriting into the memory cell, tRAS, is required before a precharge time (tRP) is needed to precharge the bit line and the like.

The writing sequence is basically similar to the reading sequence; after the sense amplifier is activated, the bit line is activated according to write data to write in a selected memory cell.

This type of dynamic memory needs refresh operation to retain the data in memory cells.

Conventional dynamic memories as mentioned above have the following four problems:

Firstly, for reading, the amplitude of the bit line must be large for rewriting into the memory cell. This means that the cycle time (tRC) as expressed by tRAS+tRP must be long.

Secondly, for writing, non-selected memory cells should operate in the same way as for reading, which also leads to a longer cycle time tRC as in the case of reading operation.

Thirdly, for the above two reasons, if the dynamic memory is fully pipelined, the pipeline pitch must be long.

Fourthly, due to the necessity for refreshing operation, access to the dynamic memory (external access) for purposes other than refreshing and access to it for refreshing compete with each other, resulting in a performance deterioration.

SUMMARY OF THE INVENTION

To solve the above-mentioned problems, the present invention provides a semiconductor device which has: a memory circuit which includes plural memory cells provided at intersections of plural bit lines and plural word lines; and an access control circuit which receives an external command and an external address to read data from or write data to the memory circuit at the transition point of a first clock, and supplies them to the memory circuit as an internal command and an internal address to read data from or write data to the memory circuit, at the transition point of a second clock whose frequency is higher than that of the first clock. The access control circuit further has a refresh control circuit which refreshes the plural memory cells at the transition point of the second clock, a timing which does not allow the external command and the external address to be supplied.

Thanks to this configuration, in the memory circuit, even when memory cells require refreshing, the refreshing operation can be isolated from external control as an internal operation so that it can be concealed from outside.

BRIEF DESCRIPTION OF THE DRAWINGS

Preferred embodiments of the present invention will be described in detail based on the followings, wherein:

FIGS. 8A and 8B show examples of usage of a dynamic memory according to this invention in case where no cache memory can be used;

DETAILED DESCRIPTION OF THE PREFERRED EMBODIMENTS

Preferred embodiments of this invention are detailed next, referring to the attached drawings. Non-limitatively, in these embodiments, circuit elements which constitute blocks are formed on a single semiconductor substrate of single crystal silicon or other similar material using publicly known circuit integration techniques such as complementary MOS transistors (CMOS). The circuit symbol for Metal Oxide Semiconductor Field Effect Transistor (MOSFET) without an encircled gate symbol represents an n-MOSFET (NMOS), while the one with an encircled gate symbol represents a p-MOSFET (PMOS). Hereinafter, MOSFET is abbreviated to as MOS or a MOS transistor. However, application of this invention is not limited to field effect transistors which have an oxide insulation film between a metal gate and a semiconductor layer; it can be applied to circuits which use ordinary field effect transistors like Metal Insulator Semiconductor Field Effect Transistors (MISFETs).

Although the meanings of latches, flip-flops and registers are different in a strict sense, they are collectively referred to as latches herein unless otherwise specified.

Embodiment 1

Figure 1:
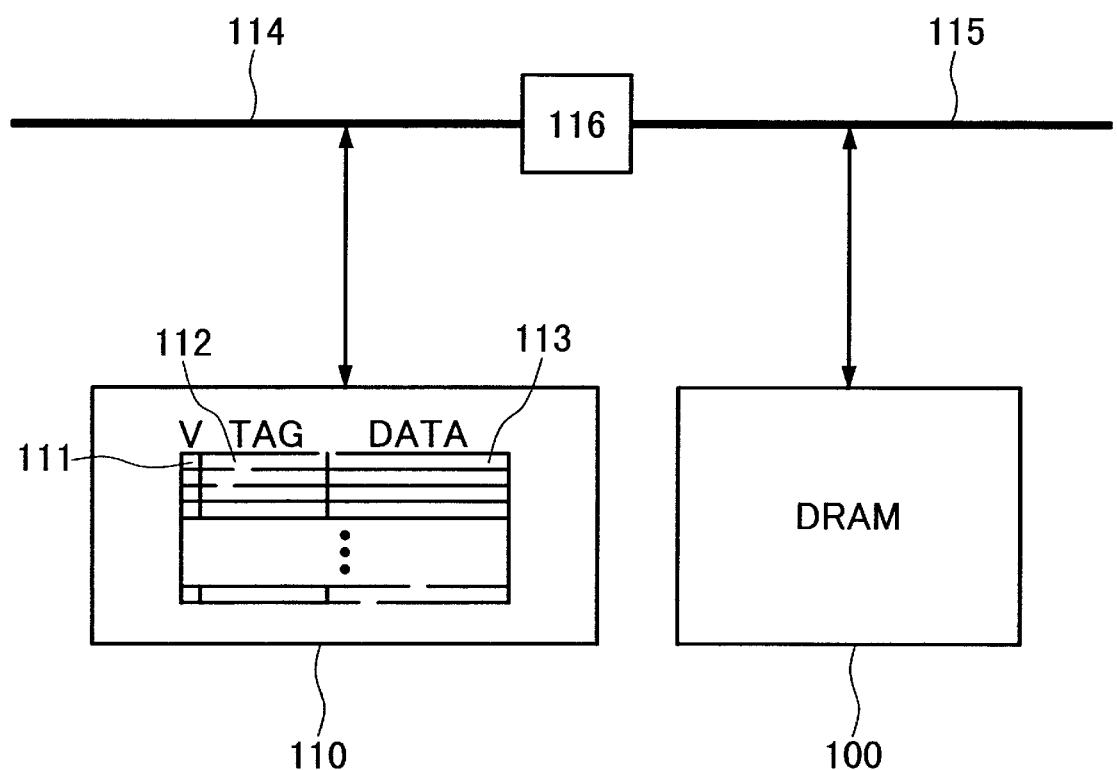
FIG. 1 illustrates an embodiment according to this invention.

FIG. 1 shows a typical preferred embodiment of this invention. According to this invention, the memory unit consists of a dynamic memory 100 and a cache memory 110. In the cache memory 110, numeral 111 denotes a valid bit, 112 and 113 denote the address and data for each entry, respectively. Numeral 114 denotes a bus connected with the cache memory 110, 115 abus connected with the dynamic memory 100, and 116 a bus controller which controls the buses.

Figure 3A:
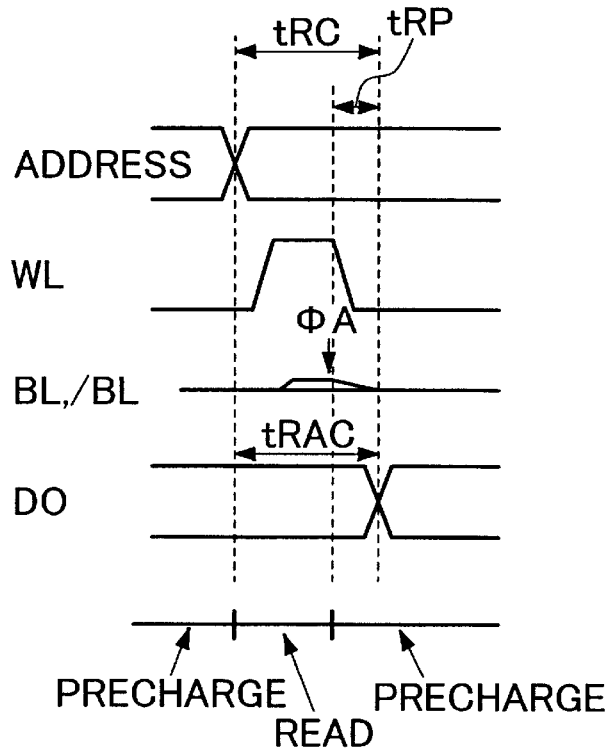
FIGS. 3A and 3B show an example of operating waveforms of a dynamic memory according to this invention.
Figure 3B:
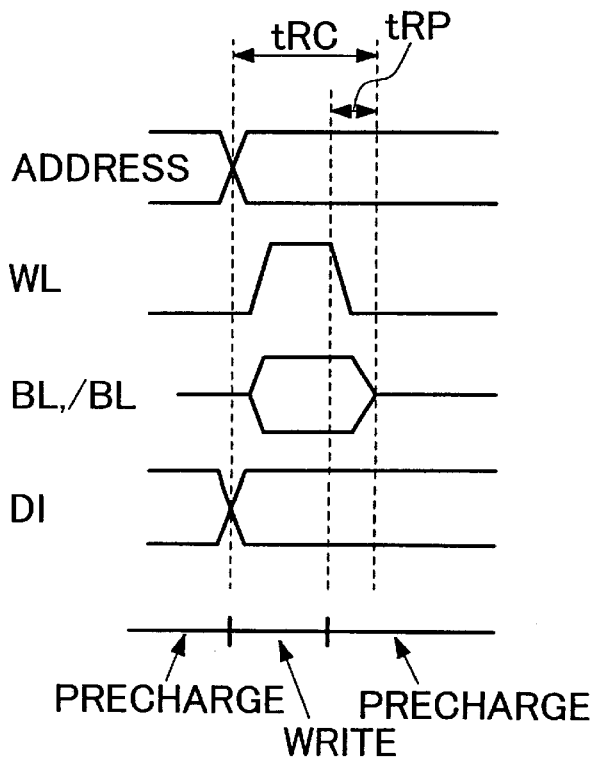

The dynamic memory 100 operates as illustrated in FIGS. 3A–3B. For reading, after word line WL is asserted, the sense amplifier is activated at the timing ΦA. As a result, when tRAC has elapsed after address input, data DO is outputted. Unlike conventional dynamic memories, rewriting operation is not performed to amplify the read signal and send it onto the bit line and write it into a memory cell.

This means that it is unnecessary to amplify data and send it onto bit line BL, /BL as in the conventional method and thus the power required to charge or discharge the bit lines can be saved. Also, time which corresponds to tRAS shown in FIG. 2, needed in the conventional method, is not required. Although tRP is needed as a precharge time for the bit lines and so on, the required precharge time is relatively short because the amplitude of bit line BL, /BL remains small.

For writing, only the word line WL for the selected memory cell is asserted; as soon as the word line WL is asserted, bit line BL, /BL is activated according to the write data.

Since rewriting into memory cells does not take place during reading operation, this is destructive readout. The cache memory 110 is used to protect the data. The data read from the dynamic memory 100 is sent to the cache memory 110, which then stores the read data in a certain entry while the valid bit for the entry is set. In replace operation of the cache memory, regarding the entry whose valid bit has been set, as soon as new data is stored in the entry, the old stored data is written back to the dynamic memory 100 (this control is done as in the write-back process which uses the write process in the write allocate method).

As a result of the above-mentioned control, the data destructively read from the dynamic memory 100 is stored in an entry in the cache memory 110; when the data is forced out of the cache memory 110 or replaced, it is written back to the dynamic memory 100 because the valid bit for it has been set. In this way, data shuttles between the dynamic memory 100 and the cache memory 110, so no original data is lost.

Data flows between the dynamic memory 100 and the cache memory 110 are controlled by the bus controller 116. However, as a matter of course, if the dynamic memory 100 and the cache memory 110 can be directly connected by a single bus, the bus controller as shown in FIG. 1 is not needed.

One example of a sense amplifier suitable for the dynamic memory 100 according to this invention is a sense amplifier based on the direct sensing scheme as introduced on page 165 of the book about VLSI memories authored by Kiyoo Itoh (published by Baifukan). In this scheme, memory cell signals can be taken out to the shared data output line without waiting for the sense amplifier to amplify and send data onto the bit line, which permits quicker operation. If this scheme is directly used in a conventional dynamic memory, an amplifier for rewriting into memory cells must be installed in parallel with the sense amplifier; on the other hand, the dynamic memory according to this invention does not need any amplifier for rewriting.

Figure 4:
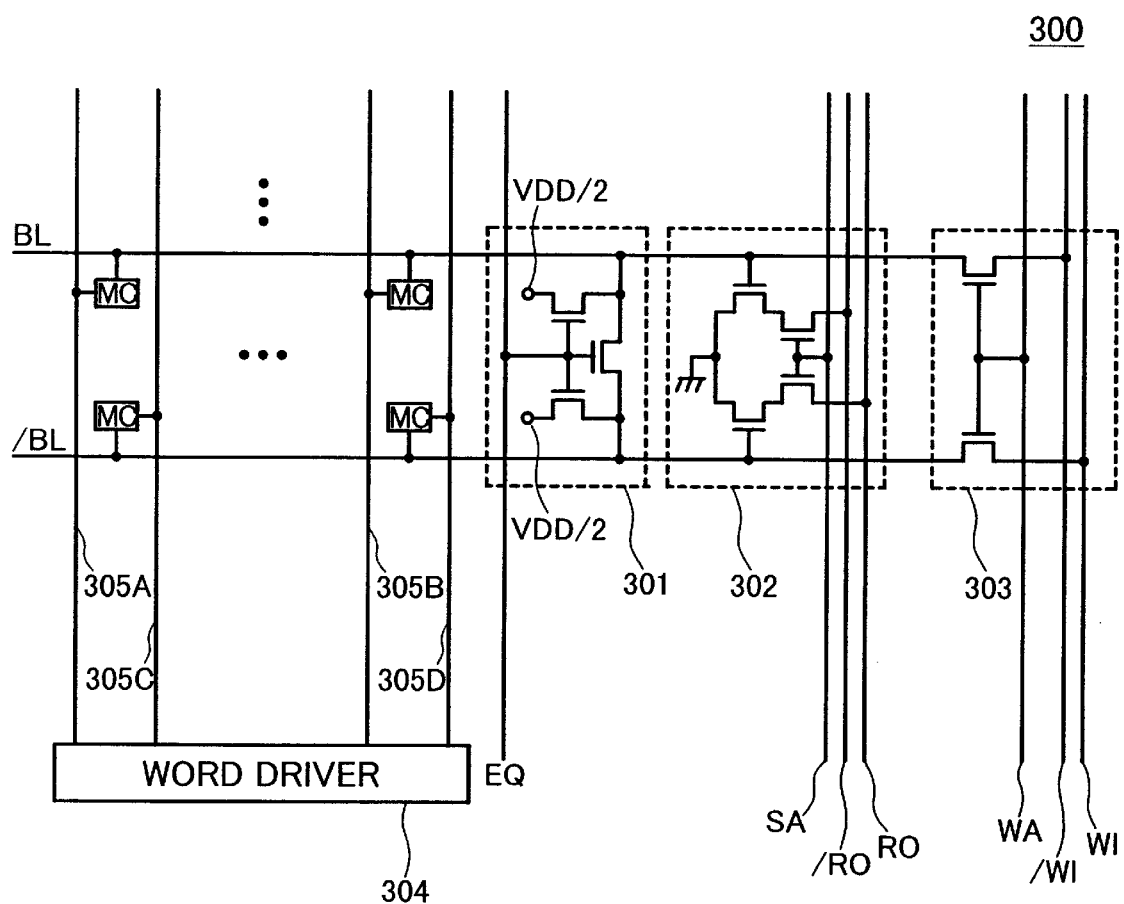
FIG. 4 illustrates an embodiment of a dynamic memory based on a direct sensing scheme according to this invention.

FIG. 4 shows an embodiment in which a sense amplifier based on the direct sensing scheme is mounted in the dynamic memory 100 according to this invention. MC represents a dynamic memory cell, numeral 301 an equalizer circuit, 302 a sense amplifier circuit based on the direct sensing scheme, 303 a write amplifier circuit, 304 a word driver circuit, 305A to 305D word lines, BL and /BL bit lines, EQ an equalizer start signal, SA a sense amplifier start signal, and WA a write amplifier start signal. RO and /RO denote output lines from the sense amplifier circuit, WI and /WI input lines to the write amplifier circuit, with these two dual rail signal lines constituting I/O lines. A distinctive feature here is the absence of a rewrite amplifier circuit. In this example, the output lines and input lines are separate lines; however, a pair of common lines may be used for both input and output instead. In other words, input/output lines may be either two pairs of lines (one for writing and one for reading) or one pair for both writing and reading.

Figure 5A:
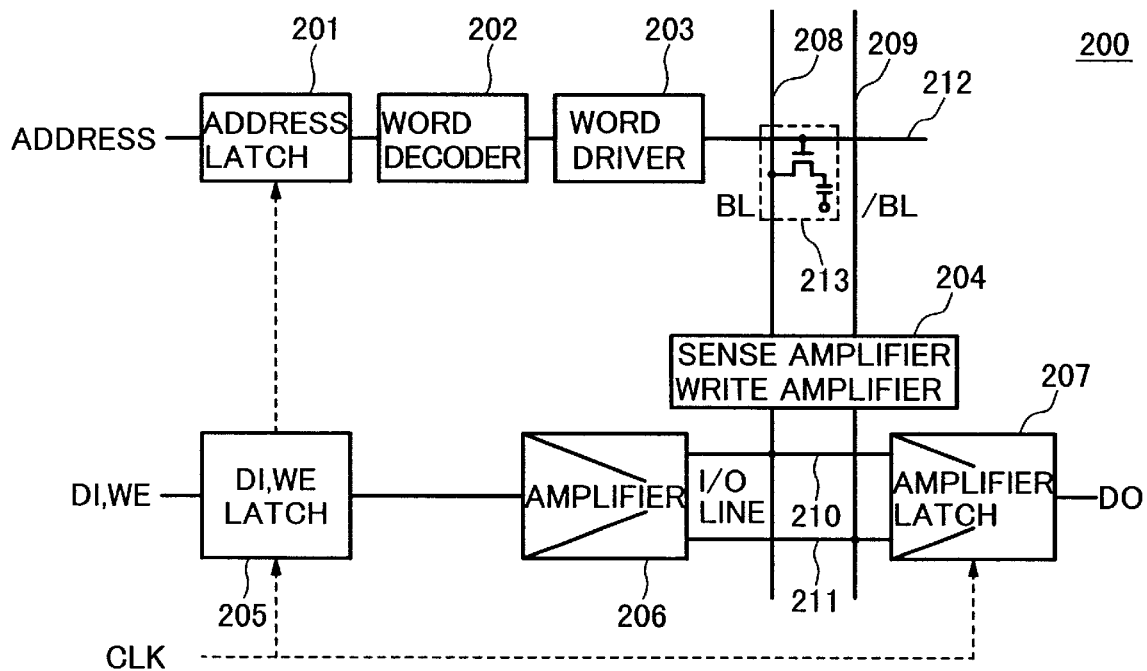
FIGS. 5A, 5B and 5C illustrate an embodiment of a pipelined dynamic memory according to this invention and its operating waveforms.

As explained above, in the dynamic memory 100 according to this invention, tRC is remarkably shorter than in conventional dynamic memories. When the dynamic memory 100 is pipelined as shown in FIG. 5, the pipeline pitch can be decreased by taking full advantage of this feature. In FIG. 5A, 200 represents the structure of a pipelined dynamic memory according to this invention. Numeral 201 represents an address latch, 202, an address decoder, 203 an address driver, 204 a sense amplifier and write amplifier, 205 an input data DI latch, 206 a write buffer, 207 an I/O line amplifier which amplifies the signals on I/O lines 210 and 211, 208 and 209 a bit line pair BL and /BL, 210 and 211 an I/O line pair, 212 a word line, and 213 a memory cell. This is a 2-stage pipeline structure in which clock CLK is inputted to 201, 205 and 207.

For reading, the address latched by 201 is decoded and then one of the word lines 212 is selected and asserted. The memory cell data outputted to the bit line BL, /BL is amplified by 204. The amplified memory cell data is latched by 207 according to the next clock and outputted as output data DO.

Figure 5B:
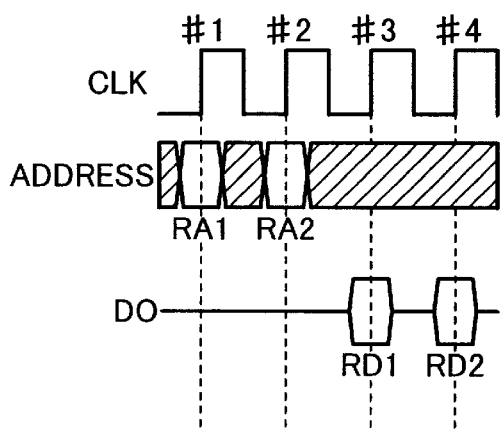

FIG. 5B is a timing chart for the above reading sequence. Read address RA1 is inputted at the leading edge marked #1 of clock CLK and data RD1 is outputted at #2. The data RD1 is fixed at #3, so the device or circuit which has issued a read request at #1 can read data from the dynamic memory 100 with a latency of 2. Likewise, data RD2 which corresponds to the read address RA2 inputted at #2 is outputted at #3 and can be read at #4. Data can be loaded 2 clocks after issuance of a read request, which means that the read latency is 2.

For writing, the address latched by 201 is decoded and then one of the word lines 212 is selected and asserted. At the same time, the write data is latched by 205 and the bit line BL, /BL is activated by 206. This action initiates writing into a memory cell.

Figure 5C:
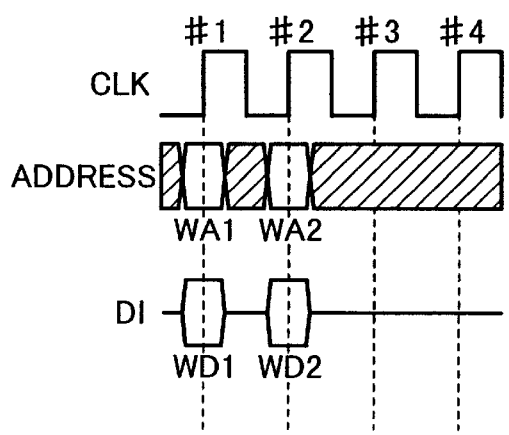

FIG. 5C is a timing chart for the above writing sequence. Write address WA1 is inputted at the leading edge marked #1 of clock CLK and simultaneously write data WD1 is inputted at #1. Writing operation is completed before the next clock #2, and the next write address WA2 and write data WD2 are inputted at #2. In response to a write request, writing can be finished within the same clock as for address input, which means that the write latency is 0.

In the above explanation of the two sequences, precharge operation for the bit line BL, /BL, I/O line and the like is omitted. The procedure for precharging them is not limited; precharging may be done during the period between the leading edge of clock CLK and the timing of word line assertion.

One of the drawbacks of conventional dynamic memories is that when they are pipelined, the pipeline pitch is long. A typical traditional approach to hide this drawback superficially is the adoption of a method such as multi-bank interleave. However, such a method has the following problem: if the same bank is accessed successively, the pipeline might be disturbed and bank control is complicated.

Figure 6A:
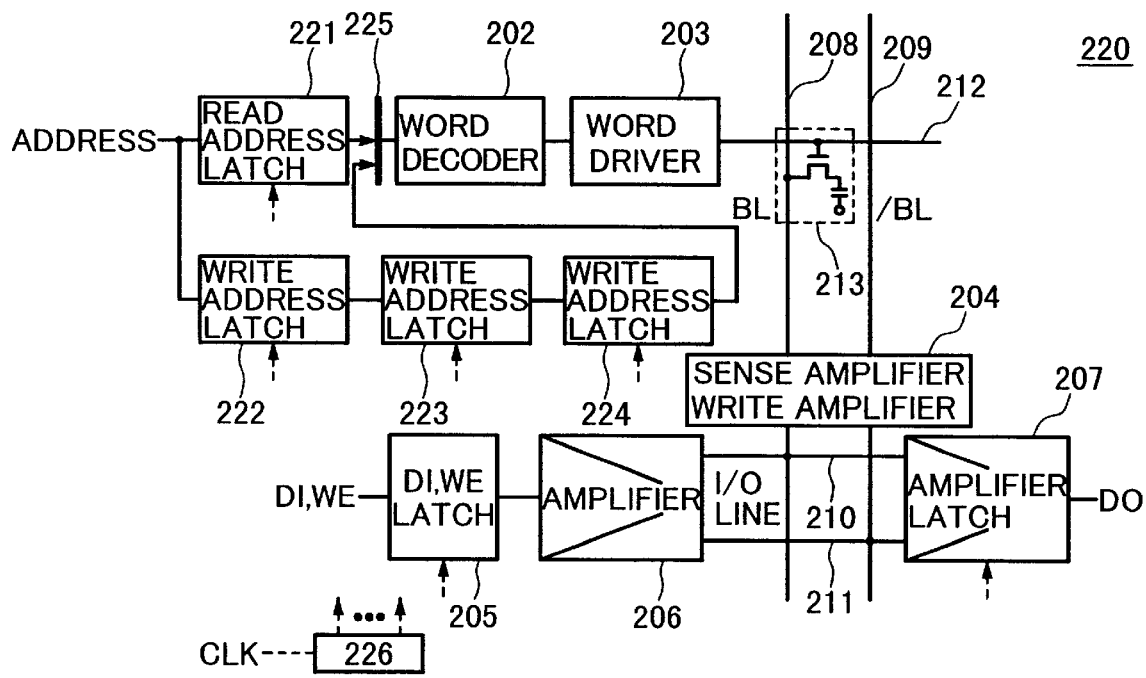
FIGS. 6A, 6B and 6C show an embodiment of a pipelined dynamic memory according to this invention, in which the write latency is identical to the read latency, as well as its operating waveforms.

FIG. 6A shows an embodiment in which the write latency and the read latency are identical in the dynamic memory shown in FIG. 5. An exact definition of latencies as used in this application is as follows. A read latency is the number of clocks (pulses) from the clock edge at which a read request is made, until the clock edge at which the data is loaded. A write latency is the number of clocks from the clock edge at which a write request is made, until the clock edge at which write data is inputted.

Numeral 221 represents a read address latch, 222, 223 and 224 write address latches, and 225 a selector. The arrowed broken lines express clock lines, which are controlled by a write data controller 226 as follows. Here, the address latch shown in FIG. 5 is replaced by the read address latch 221, write address latches 222–224 and the selector 225. The input clocks for the address latches and the input clock for 205 are controlled by the write data controller 226 as follows.

As a write address is inputted, the write address latches 222–224 delay the address. The write data which is inputted two clocks after input of the write address is latched by 205 and gets ready for writing. At the timing when a next write access request is issued after this write access, writing into the memory cell according to the address latched by 224 and the data latched by 205 takes place with a write latency of 0. Therefore, writing is performed at the timing of the next or subsequent write access (actually, writing into the memory cell takes place at or after the timing when the write address and write data both become available, or at the timing of a subsequent write request, which means that writing is "delayed"). While the write latency is 0 and the read latency is 2 in the structure shown in FIG. 2, the write and read latencies may be both 2 in the structure shown in FIG. 6A.

Figure 6B:
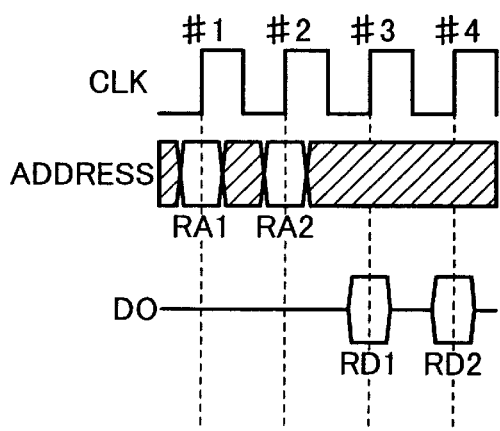

FIG. 6B is a timing chart for the above reading sequence. The reading sequence is basically the same as that shown in FIG. 5B. Read address RA1 is inputted at the leading edge marked #1 of clock CLK and data RD1 is outputted at #2. The data RD1 is fixed at #3, so the circuit or device which has issued a read request RA1 at #1 can read corresponding data RD1 with a latency of 2. Likewise, data RD2 which corresponds to the read address RA2 inputted at #2 is outputted at #3 and can be read at #4. Data can be loaded 2 clocks after issuance of a read request, which means that the read latency is 2.

Figure 6C:
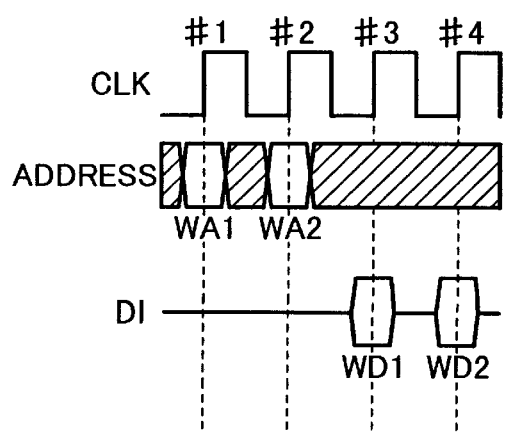

FIG. 6C is a timing chart for the above writing sequence. Write address WA1 is inputted at the leading edge marked #1 of clock CLK and latched by write address latch 222. It is latched by write address latch 223 at #2 and by write address latch 224 at #3. At #3, also write data WD1 is latched by input data DI latch 205 and gets ready for writing. writing of WA1 and WD1 into the memory cell is performed at #3 or subsequent write input. Write data is loaded two clocks after write address input, which means that the write latency is 2.

Obviously, to achieve a write latency of 2 as shown in FIG. 6C, assuming that a read request is issued at #3 in FIG. 6C, the input data DI latch 205 should be able to latch up to 2 write data. Such a latch can be easily realized by a first-in-first-out buffer or something like that though not limited so.

By making the write and read latencies identical, plural access requests or refresh requests from the CPU or bus master can be sent to the dynamic memory without disturbing the pipeline. In addition, for a device or circuit which uses a dynamic memory according to this invention, not only the read latency but also the write latency are fully predictable. Therefore, write data can be easily put into the dynamic memory with the same latency as the read latency, thereby increasing the pipeline fill rate in case where both read and write data are present. Especially when the output data line DO and input data line DI are used as common input/output data lines, the above-mentioned effect is more significant since timesharing must be used to transmit input data and output data separately. Also, for "read modify write access," since data which has been read must be used for processing before writing it, the pipeline fill rate can be increased more easily when the read latency and write latency are the same.

In the sequence as shown in FIG. 6C, data is actually written only at least 2 clocks after write access. Therefore, if, after write access request, the same write-requested address is requested for read access, attention should be paid to data coherency. There is a solution to this problem as given below.

(1) If, one clock after write access request WA1, read access request RA2 is made to the same address, write data WD1 which responds to write access request WA1 must be outputted as read data RD2 which responds to read access request RA2. However, because write data WD1 has not been written into a dynamic memory cell yet, it is possible that at the next clock after read access request RA2, write data WD1 is inputted, and then at the clock after the next clock, write data WD1 is forwarded for output as read data RD2 which responds to read access request RA2.

(2) If, two clocks after write access request WA1, read access request RA2 is made to the same address, write data WD1 which responds to the write access request WA1 inputted at that clock may be, at the next clock after read access request RA2, forwarded for output as read data RD2 which responds to read access request RA2.

Figure 7:
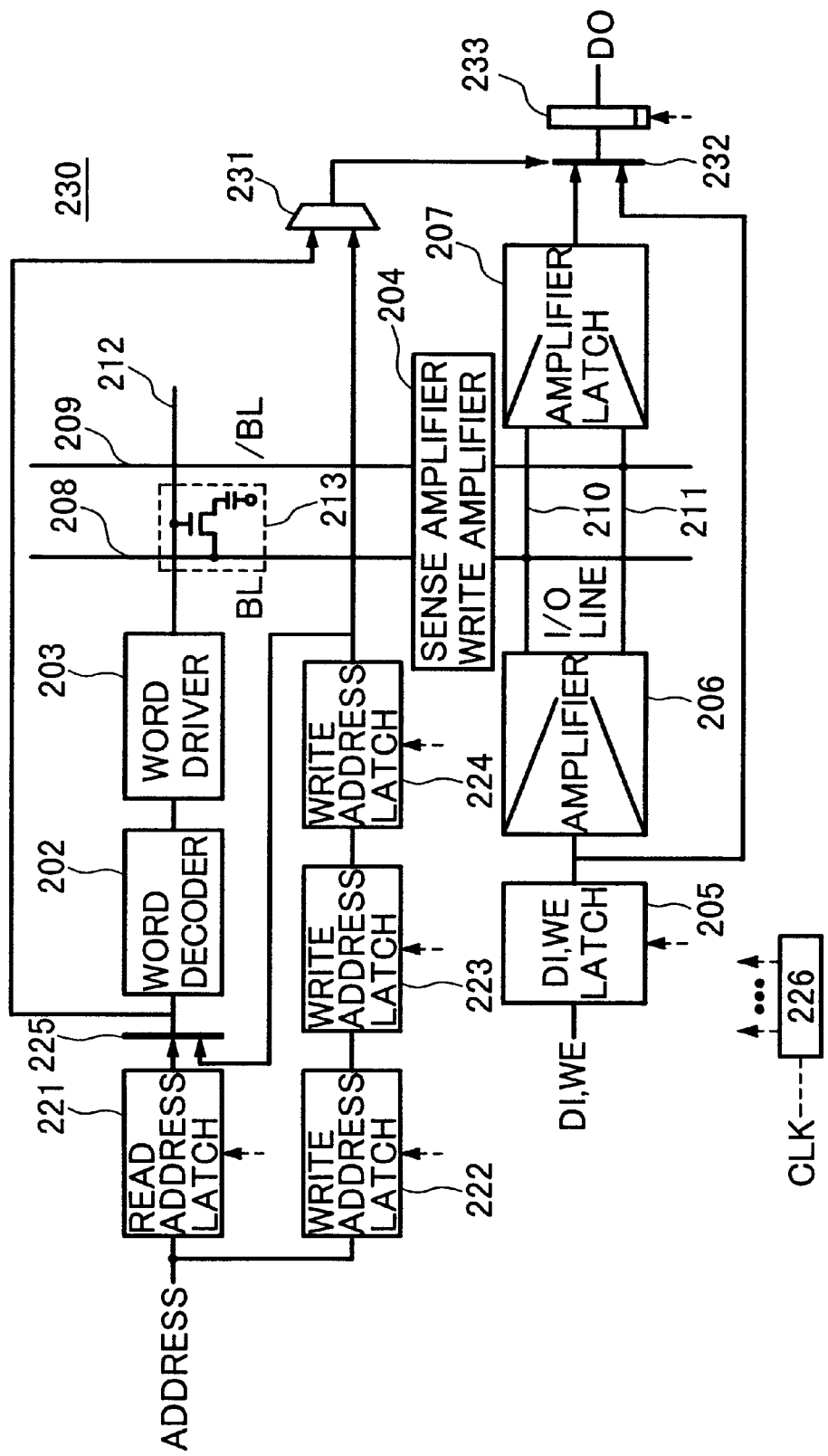
FIG. 7 shows an embodiment which has a forward circuit in addition to the embodiment shown in FIG. 5.

FIG. 7 shows another example in which a forward circuit is added to the circuitry shown in FIG. 6A. Numeral 231 represents an address comparator, 232 a selector and 233 a latch. The address comparator 231 compares the address data latched by write address latches 222–224 with the read-requested address, and if an access request is made to the address for which writing into the memory cell has not been completed, read data which responds to the request is forwarded from the input data DI latch 205 to the latch 223 through the selector 232.

As far as the above-mentioned operational sequences can be realized, any structure other than the one shown in FIG. 7 is also acceptable.

Regarding the number of pipeline stages and the method of pipeline partitioning in the dynamic memory shown in FIGS. 5 to 7 according to this invention, any alternatives to those shown in these figures may be used. For instance, it is acceptable that a latch is provided between the word decoder 202 and the word driver 203 to increase the number of pipeline stages, or that the sense amplifier 204 is used as a pipeline latch to increase the number of pipeline stages. Clearly, as the number of pipeline stages increases, the pipeline pitch can be shortened, leading to a higher operating frequency.

Since the dynamic memory in this invention is used for destructive readout, basically it is necessary to assert only the word line connected to the memory cell which stores the data to be read. If the word line should be asserted without data reading, the content of the memory cell would be destroyed by the word line and not read out from the dynamic memory so it would be lost from the entire system which uses this dynamic memory. For this reason, when the bit width of the data to be read at a time is small and the number of memory cells to be selected is small, word lines should be divided into many sub-word lines and only the word line connected with the memory cell storing the data to be read should be decoded and asserted. (Hereinafter, this is called the issue of word line division.) The division of word lines will result in an area increase. However, by increasing the number of memory cells which are read at a time, the number of sub-word lines can be decreased in a manner to prevent an area increase. This can be achieved by the procedure mentioned below.

(1) When the cache memory 110 and the dynamic memory 100 are integrated on a semiconductor chip, the cache memory's line size can be increased to increase the number of memory cells selectable at a time due to the absence of a bottleneck associated with the number of pins in the package which contains the dynamic memory. As an extreme example, the memory cells in the cache memory may be arranged in parallel with the sense amplifier. It is also possible that the width of data between the dynamic memory 100 and the cache memory 110 is increased (for example, to 1024 bits) and the width of data between the semiconductor chip bearing them and the outside is smaller than that (for example, 32 bits). By adopting these methods, the problem of a bottleneck associated with the number of pins in the package can be avoided and an area increase in the dynamic memory 100 as mentioned above can be minimized.

(2) When the primary or secondary cache of the CPU is used as the cache memory 110 and integrated on a chip other than the one bearing the dynamic memory 100, the size of data transmission only between the cache memory 110 and the dynamic memory 100 should be increased. If the secondary cache of the CPU is used as the cache memory 110, the line size of the secondary cache should be increased.

The data stored in the dynamic memory according to this invention is present in the cache memory 110 or the dynamic memory 100. If more than one bus master are used for these memory systems, the problem of so-called "coherency" may arise. This problem can be resolved as follows.

(1) If the cache memory 110 and the dynamic memory 100 are integrated on a semiconductor chip and access to the chip is made only through the cache memory 110, the problem of coherency never occurs as there is no direct access to the dynamic memory 100.

(2) If the cache memory and the dynamic memory 100 are integrated on different chips, the primary or secondary cache of the CPU may be used as the cache memory 110. Although direct access to the dynamic memory 100 from more than one CPU is possible, coherency compensation such as the snooping function using the MESI protocol, etc. incorporated in the CPU, primary cache or secondary cache controller can be used directly. When data is read from the dynamic memory 100, the valid bit for the entry of the data is set and thus the MESI protocol monitors access to the entry from other CPUs.

FIGS. 8A and 8B shows a fully pipelined dynamic memory as an embodiment of this invention, where the cache memory 110 cannot be used. Since the dynamic memory according to this invention is of the destructive readout type as mentioned earlier, data once read is not present in the dynamic memory. FIGS. 8A and 8B indicate that in the pipelined dynamic memory, immediately after reading (RA1, RD1), writing (WA1, WD1) of the read data in the same address takes place. FIG. 8A shows waveforms for the example shown in FIG. 5. FIG. 8B shows waveforms for the example shown in FIG. 6 or FIG. 7 which uses the delayed write scheme. As described above, when the scheme shown in FIG. 6 or FIG. 7 is used, a new access request (RA2) can be accepted at #3, so access overhead can be reduced to only 1 clock. If more than one bus master are provided, write access in continuous read/write operation for rewriting as mentioned above should be most preferred for coherency compensation. (Hereinafter, the data retention method for destructive read memory cells which uses this type of pipeline is called a "pipeline rewrite technique.")

The methods illustrated in FIGS. 8A and 8B can be used not only when the cache memory 110 is not available but also when valid bit control for the cache memory 110 is impossible. It can also be used when the cache memory 110 is an instruction cache.

The cache memory 110 shown in FIG. 1 may be integrated on the same semiconductor chip that bears the dynamic memory 100, or may be integrated on a different chip.

When the dynamic memory 100 is used as the main memory of the CPU, it is best to use the cache memory 110 as the primary cache of the CPU. Alternatively, it is acceptable to construct a memory system consisting of the primary and secondary caches of the CPU. In this case, the optimum sequence is as follows: the data read from the dynamic memory 100 is written in the primary cache; and when the data is deleted from the primary cache, it is written in the secondary cache; then when it is replaced in the secondary cache, it is written back into the dynamic memory 100. As stated above, the cache memory 110 may also serve as the primary or secondary cache of the CPU to enhance the area efficiency.

The number of cache memories 110 is not limited. It is also possible that the cache memory 110 has more than one hierarchical memory level. Two caches—one instruction cache and one data cache—may be provided. For the data cache, the access process based on the valid bit as explained for the example in FIG. 1 may be used, while for the instruction cache, the process described for the example in FIG. 8 may be used for write access to be made after read access. Another approach is that the dynamic memory 100 provides two modes: one mode for dynamic memory access according to this invention and the other mode for conventional dynamic memory access. Depending on the type of access, the mode for more efficient access may be selected, which permits more efficient use of the dynamic memory 100.

Though the above examples use valid bits, the existence of valid bits is not a prerequisite. Also, the line size, the number of ways, capacity and so on of the cache memory 110 are not limited. It is sufficient that the data destructively read from the dynamic memory 100 is stored in the cache memory 110, and the data forced out of the cache memory 110 is stored in the dynamic memory 100. If two or more cache memories are provided, control should be made in a way that data is always present in the cache memories and the dynamic memory. The important thing is that the data destructively read from a dynamic memory should be stored in any memory (cache memory in this invention) available throughout the system which uses the dynamic memory, except the dynamic memory. As far as this condition is met, any system configuration may be used.

Furthermore, the number of dynamic memories 100 is not limited. The method disclosed in this invention may apply to plural dynamic memory chips or to some of plural dynamic memory chips.

Besides, the structure of memory cells in the cache memory 110 is also not limited. It may be of the dynamic type in which a capacitance stores electric charge to memorize data, or of the SRAM memory cell type which uses poly-resistors or TFTs, or fully complementary MOS SRAM type which uses six MOS transistors.

Embodiment 1 of this invention explained so far is summarized as follows.

(1) In a semiconductor device which has a dynamic memory which has plural dynamic memory cells provided at intersections of plural word lines and plural bit lines, and plural sense amplifiers provided for the respective plural bit lines, and plural input/output lines provided for the respective plural sense amplifiers, for reading, the dynamic memory selects one of the word lines and reads out the signal of the corresponding dynamic memory cell to the corresponding plural bit lines; then without transition to the phase of rewriting of the read signal into the dynamic memory cell, the plural sense amplifiers amplify the signal read out to the bit lines, on the input/output lines before the plural bit lines are precharged (first read mode 1).

(2) In addition, the dynamic memory further has a write amplifier for the corresponding bit line, and for writing into the dynamic memory cell, the write amplifier outputs write signal to the corresponding bit line, just after or before or at the same time as selection of the corresponding word line, to write the signal into the dynamic memory cell (first write mode).

(3) The semiconductor device as described above in (1) and (2) is further provided with at least one cache which consists of static memory cells, and in reading data from the dynamic memory, the reading sequence as mentioned above is used to read data from the dynamic memory and the data is written in at least one the cache, and when the data is deleted from all the caches, the data is written back to the dynamic memory.

The semiconductor device which includes a dynamic memory as described above in (1) through (3) is provided with an address latch circuit which receives the row address to select the word line to be accessed, from among the plural word lines, where the address latch circuit latches the row address at each transition point of the first clock signal which has a prescribed cycle time.

(5) The pipelined dynamic memory as mentioned in (4) is further provided with a write delay circuit which receives a first write address and a first write data which are inputted at a first write access, where writing into the dynamic memory cell in response to the first write access is performed for the first write address and the first write data which are stored in the write delay circuit, at the timing of the second write access after the first write access.

(6) The dynamic memory as described in (5) is further provided with a forward circuit having an address comparator, where, in read access, the forward circuit compares the inputted read address with the first write address through the address comparator, and if there is a read access to the same address as the first write address between the first write access and the second write access, the first write data is outputted as read data which responds to the read access.

Embodiment 2

Figure 9:
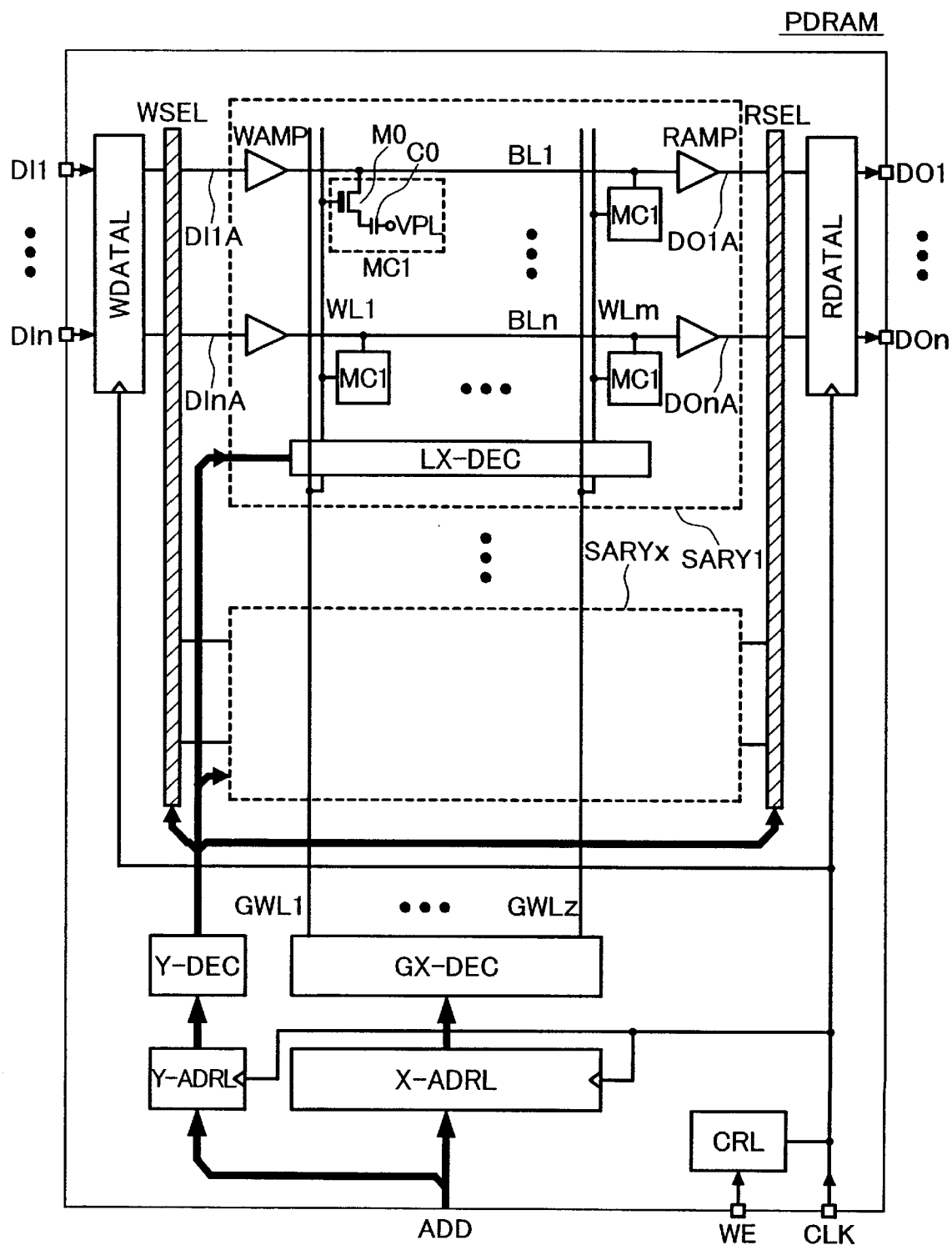
FIG. 9 illustrates an embodiment of a pipelined dynamic memory.

FIG. 9 shows a pipelined DRAM (PDRAM) as an embodiment of this invention in more concrete form. M0 represents an n-MOS transistor and a memory cell MC1 consists of an n-MOS transistor and a capacitor C0. BL1 to BLn represent bit lines, WL to WLm word lines and the above-said memory cells are connected at the intersections of the word lines and bit lines. (In the folded bit-line structure as stated on page 90 of the book about VLSI memories by Kiyoo Itoh, published by Baifukan in 1994, memory cells are not always connected at the intersections of bit lines and word lines. This invention does not limit the bit line arrangement to the one shown in FIG. 9.) RAMP denotes a read amplifier, WAMP a write amplifier, and LX-DEC a word line decoder (including a word line driver circuit). SARY1 to SARYx represent sub-arrays composed of the above-mentioned circuits and the like. WDATAL denotes a write data latch, RDATAL a read data latch, WSEL a write data selector, RSEL a read data selector, Y-DEC a Y decoder (including a Y driver), Y-ADRL a Y address latch, GX-DEC a global word line decoder (row decoder including a global word line driver), X-ADRL an X address latch (row address latch circuit), CRL a timing control circuit, GWL1 to GWLz global word lines, DI1 to DIn input data, DO1 to DOn output data, ADD an address (an address is inputted without being multiplexed), WE a write enable, CLK a clock, and VPL a plate voltage.

The inputted address ADD is latched by X-ADRL and Y-ADRL at every cycle of clock CLK and decoded by GX-DEC and Y-DEC. As a result of decoding by GX-DEC, one of the global word lines GWL1 to GWLz is selected. As a result of decoding by Y-DEC, one of the sub-arrays SARY1 to SARYx is selected. The decoding result for the global bit lines GWL1 to GWLz and Y-DEC is inputted to LX-DEC and one of the word lines WL1 to WLm in the selected sub-array is selected and activated. The number of memory cells to be selected by a word line is the same as the number of output or input data, n.

For reading, stored data from n selected memory cells are amplified by n read amplifiers RAMP. The amplified n data DO1A to DOnA are inputted to read selector RSEL. According to the decode signal inputted from Y decoder Y-DEC, RSEL selectively connects n data DO1A to DOnA outputted from sub-arrays SARY1 to SARYx to n inputs of read data latch RDATAL. The n data sent to the read data latch RDATAL are latched by read data latch RDATAL according to clock CLK, and outputted as DO1 to DOn to outside the pipelined dynamic memory PDRAM.

For writing, input data DI1 to DIn are latched by write data latch WDATAL according to clock CLK, and inputted to write data selector WSEL. WSEL selects a sub-array for writing according to the decode signal inputted from Y decoder Y-DEC, and n data from WSEL are selectively connected to n inputs DI1A to DInA of sub-arrays SARY1 to SARYx. The inputted n data DI1A to DInA are amplified by write amplifier WAMP and written in n selected memory cells as memory data through bit lines.

In the structure shown in FIG. 9, the operational sequences shown in FIG. 3A and FIG. 3B can be achieved by pulse-driving the word lines WL1 to WLm for a specified period within the clock CLK cycle. Also, as mentioned earlier, because rewriting is not made, the pulse width of the above word lines can be shortened, enabling the pipeline pitch determined by it (clock CLK cycle) to be shorter. Since the structure in FIG. 9 is basically the same as that of embodiment shown in FIG. 5A, timing charts which illustrate the reading and writing sequences in this case are the same as those in FIGS. 5B and 5C.

In the structure shown in FIG. 9, the issue of word line division as mentioned earlier is resolved by hierarchically dividing the word lines into global word lines GWL1 to GWLm and word lines WL1 to WLm. The number of global word lines GWL1 to GWLm are the same as the number of word lines GWL1 to GWLm, but as the number of decode address bits of the Y decoder is increased, the number of global word lines GWL1 to GWLm can be smaller than m.

Though FIG. 9 does not show WAMP and RAMP circuits concretely, it is possible to use, for example, the circuits shown as 303 and 302 in FIG. 4 for WAMP and RAMP, respectively. In FIG. 9, WAMP and RAMP are located at both ends of each bit line for better illustration. The actual circuit layout is not limited to this layout. WAMP and RAMP may be located at one end of each bit line like 303 and 302 in FIG. 4. In that case, it is needless to say that write data selector WSEL and read data selector RSEL may be shared. Further, a "shared sense amplifier" system may be used by connecting bit lines to both ends of RAMP and WAMP and connecting memory cells to the respective bit lines. As discussed above, the bit line arrangement and the RAMP and WAMP arrangement are not limited to the arrangements shown in FIG. 9. Besides, again for better illustration, no precharge circuit like 301 in FIG. 4 is not shown in FIG. 9, but obviously any circuit necessary for memory circuit operation, such as precharge circuits, may be added.

Embodiment 3

Next, a refresh-free dynamic memory (RFPDRAM) which uses a pipelined dynamic memory as shown in FIG. 9, etc. is explained as another embodiment.

Figure 10:
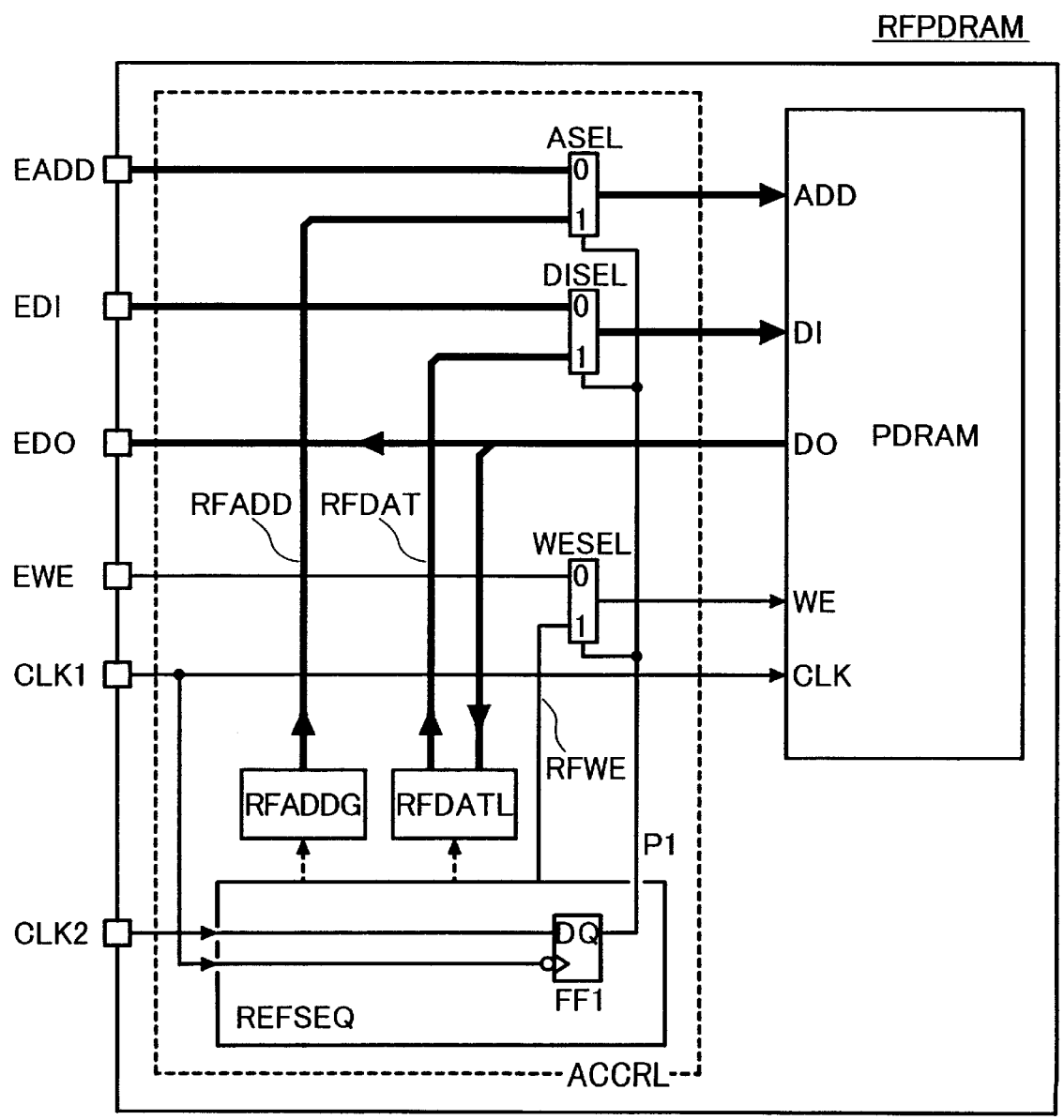
FIG. 10 illustrates an embodiment of a refresh-free dynamic memory which has an access control circuit to conceal refreshing operation from outside in addition to a pipelined dynamic memory PDRAM.

FIG. 10 shows RFPDRAM as an embodiment. Here, PDRAM corresponds to the pipelined dynamic memory as shown in FIG. 9, etc. ASEL, DISEL and WESEL represent selectors, RFADDG a refresh address generator, RFDATL a refresh data latch (data latch circuit), REFSEQ a refresh sequencer and FF1 a flip-flop, all of which constitute an access control circuit ACCRL. Here, FF1, which is what is generally called a flip-flop, memorizes input D at the timing of transition from "L" to "H" of the clock inputted at the clock input marked with a triangle, and outputs it through Q, while under other conditions the output at Q remains unchanged.

ADD represents an address terminal for PDRAM, DI a data input terminal for PDRAM and DO a data output terminal for PDRAM, and they each have a specified number of bits depending on the PDRAM capacity and the numbers of input and output bits. On the other hand, EADD represents an address terminal for RFPDRAM, EDI a data input terminal for RFPDRAM and EDO a data output terminal for RFPDRAM, and they each have as many bits as ADD, DI and DO for PDRAM. WE and EWE denote write enable signals for PDRAM and RFPDRAM, respectively. CLK, CLK1 and CLK2 represent clock signals or clock terminals.

Figure 11:
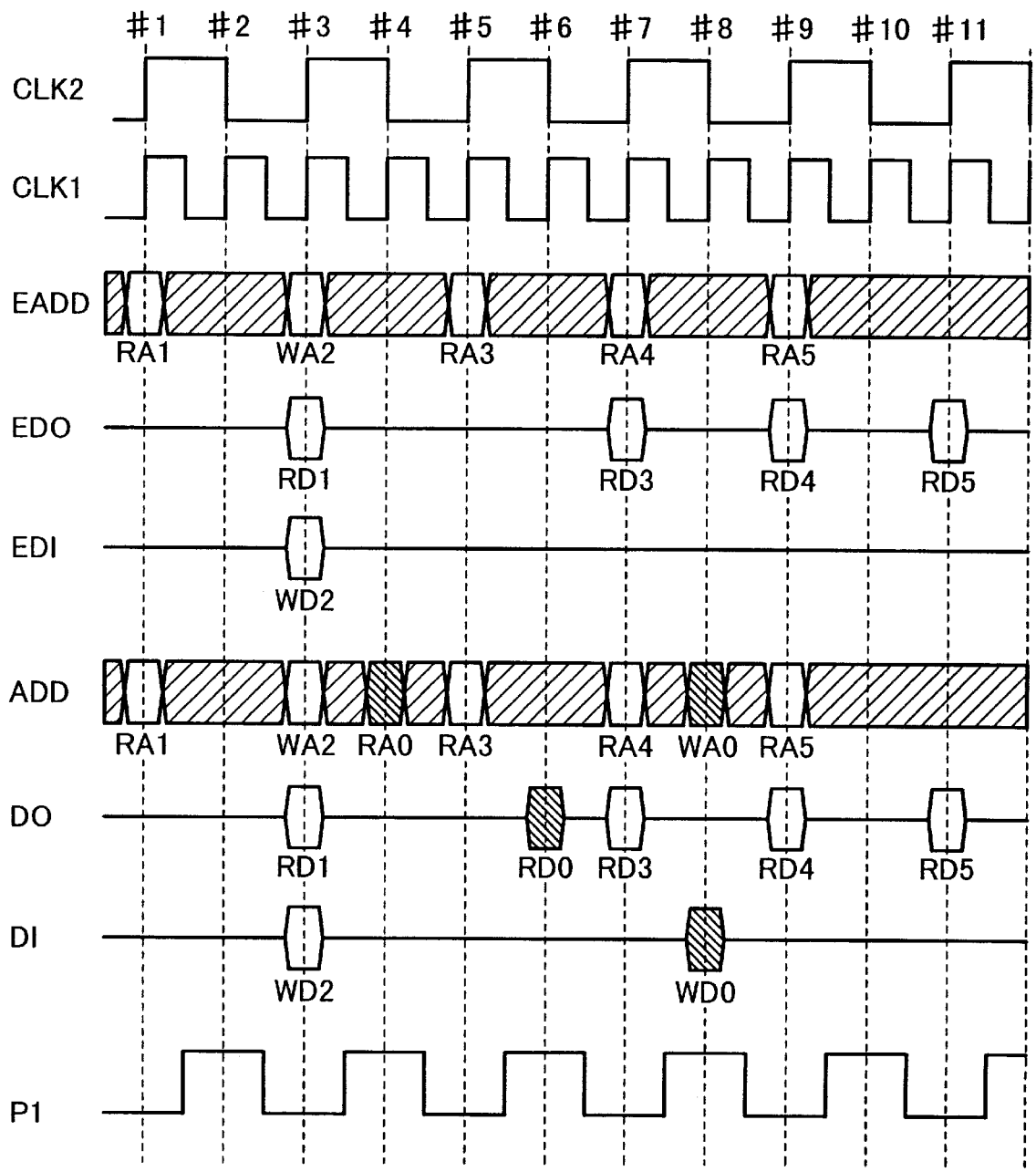
FIG. 11 is a timing chart for operation of the embodiment shown in FIG. 10.

The address EADD inputted to the refresh-free dynamic memory RFPDRAM is sent to selector ASEL together with output RFADD of refresh address generator RFADDG and selectively connected to address ADD of PDRAM according to the value of selector signal P1. Similarly, the input data DI inputted to RFPDRAM is sent to selector DISEL together with output RFDAT of refresh data latch RFDATL, and selectively connected to input data DI of PDRAM according to the value of selector signal P1. The write enable signal EWE inputted to RFPDRAM is sent to selector WESEL together with output RFWE of refresh sequencer REFSEQ and selectively connected to write enable signal WE of PDRAM according to the value of selector signal P1. Output data DO of PDRAM is sent to refresh data latch RFDATL together with output data EDO of RFPDRAM. REFSEQ carries out necessary control for refreshing PDRAM by using clock CLK1 and CLK2 inputted to RFPDRAM to control refresh address generator RFADDG, refresh data latch RFDATL and P1. FIG. 11 is a timing chart for an operation example.

Clock CLK1 is a clock whose frequency is twice that of clock CLK2, and their leading edges or rise timings coincide. External access requests from a device or circuit which uses RFPDRAM connected with EADD, EDI, EWE or the like are loaded at the timing of rise of CLK2. (For simpler illustration, such a device or circuit is not shown in FIG. 10 (?). Hereinafter it is called an external device and an access request from the external device to RFPDRAM is called an external access request.) Since output P1 in FF1 in FIG. 10 is "H" at the timing of rise of CLK2, the access request loaded at the timing of rise of CLK2 is directly sent to PDRAM for processing. In FIG. 11, as external requests, read request RA, write request WA2, read request RA3, read request RA4, and read request RA5 are loaded at #1, #3, #5, #7 and #9, respectively; in response to these access requests, RFPDRAM makes fixed output of read data RD1 at #3, input of write data WD2 at #3, fixed output of read data RD3 at #7, fixed output of read data RD4 at #9, and fixed output of read data RD5 at #11. Read data is outputted with a latency of 2 in terms of CLK1 frequency, or a latency of 1 in terms of CLK2 frequency, or no waiting time. Write data is outputted with a latency of 0.

As stated above, an external access request to the pipelined dynamic memory PDRAM is generated only every two cycles. In FIG. 11, external access requests occur only at the leading edges of odd-numbered clocks #1, #3, #5, #7 and so on. As PDRAM is fully pipelined, a request for access to PDRAM can be made every cycle of CLK1. On the other hand, in case of the structure shown in FIG. 10, an external access request can be issued at most every two cycles of CLK1, as described above. The access control circuit ACCRL issues access requests for refreshing to PDRAM in the intervals between these access requests (unoccupied pipeline slots indicated as #4, #6, #8, #10 and so on). This sequence is detailed next by reference to FIG. 11.

The access control circuit ACCRL issues refresh requests to PDRAM at regular time intervals so that the data stored in the pipelined dynamic memory PDRAM is not erased. In FIG. 11, for the refresh address RFADD generated by the refresh address generator RFADDG, read request RA0 is issued at #4, and the corresponding read data RD0 is received at #6 and stored in the refresh data latch RFDATL. Then, at #8, write request WA0 is issued to the same address to which the read request has been made, so that the dataWD0 stored in RFDATL is written there. With the above sequence, rewriting of memory cells in PDRAM takes place. After that, RFADDG counts up RFADD. This operational sequence is repeated at regular time intervals by the refresh sequencer REFSEQ so that all the memory cells in PDRAM can be refreshed.

In the above example, refreshing operation unique to any dynamic memory in which the electric charge stored in the capacitance is used to memorize data, can be completely concealed from a device or circuit which uses the dynamic memory. Also, in terms of access speed (latencies in this case), it delivers the same performance as the original pipelined dynamic memory PDRAM. (In the example in FIG. 11, the read latency is 2 in terms of CLK1, which suggests no decline in speed.) On the other hand, the maximum frequency (freql) of access request which can be issued to RFPDRAM is half the maximum frequency (freq) of access which can be accepted by PDRAM. However, as the pipeline frequency (frequency of CLK1) of PDRAM can be sufficiently high as a result of pipelining, the speed can be increased to the extent that the frequency (freq1) of access request to RFPDRAM is negligible. For instance, in case of a microprocessor which runs at 300 MHz as an external device which uses a refresh-free dynamic memory RFPDRAM, CLK may be used at 600 MHz and CLK1 at 300 MHz.

FIGS. 9 to 11 show the case that the read latency and write latency of the pipelined dynamic memory PDRAM are 2 and 0, respectively, but naturally, the application of the above refresh concealing technique is not limited to the case of using these latencies. However, if PDRAM's latency in terms of CLK1 is expressed as L and reception and transmission of data in response to an external access request are carried out in the cycle of CLK2, latency L1 in terms of CLK1 is L/2, a number whose decimal fractions are counted as a whole number. Therefore, the latency in terms of CLK1 for data reception and transmission in response to an external access request is L+1 if L is an odd number.

Embodiment 4

Refresh concealing techniques other than the one shown in FIG. 11 may be used. In the example in FIG. 11, since the PDRAM pipeline cycle is half the cycle of external access requests and external access requests are issued only at #1, #3, #5, #7 and so on of pipeline clock CLK1 of the dynamic memory, chances for refreshing can be obtained at #4, #6, #8 and #10 of CLK1. In other words, the phases of external access requests are made different from those of refresh-related access requests in order to prevent collision of both types of requests. In this way, access collision may be prevented by making the phases for both types of access different.

In addition, when the cycle of the PDRAM pipeline is shorter than that of external access requests, chances to refresh PDRAM can be obtained without fail even if external access requests are issued continuously. This means that it is acceptable that pipeline frequency CLK1 is not double that of clock signal CLK2 corresponding to the cycle for reception of external access requests, unlike the example in FIG. 11. For instance, the ratio of CLK1 frequency to CLK2 frequency is a rational number above 1, so 3/2 is acceptable. In this case, even if an external access request is issued to RFPDRAM every cycle of CLK2, there will be, every three cycles of CLK1, a period during which no external access request is issued to PDRAM. Also, if the above-said frequency ratio is 1000/999, there will be a period during which no external access request is issued to PDRAM, every 1000 cycles of CLK1. Therefore, it is sufficient for the refresh sequencer REFSEQ to issue an access request for refreshing to PDRAM at the timing when no external access request is present. Generally speaking, the refresh cycle is longer than the cycle of external access requests; so even if the frequency ratio of CLK1 to CLK2 is as small as 1000/999 or so, the CLK1 frequency can be increased to the extent that refreshing can be sufficiently done in a cycle.

Figure 12:
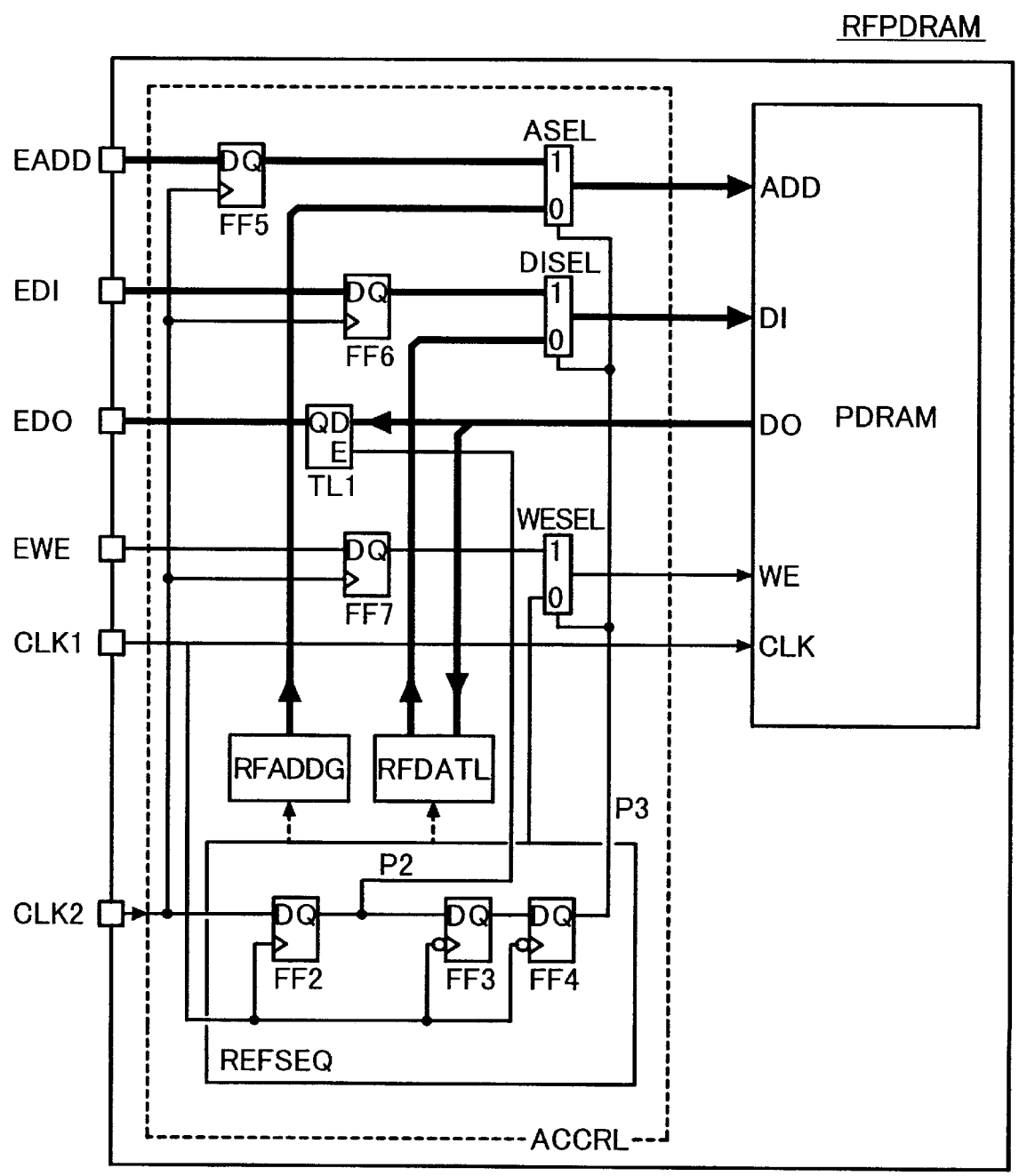
FIG. 12 illustrates an embodiment of a refresh-free dynamic memory in case where the frequency ratio of CLK1 and CLK2 shown in FIG. 10 is 3/2.
Figure 13:
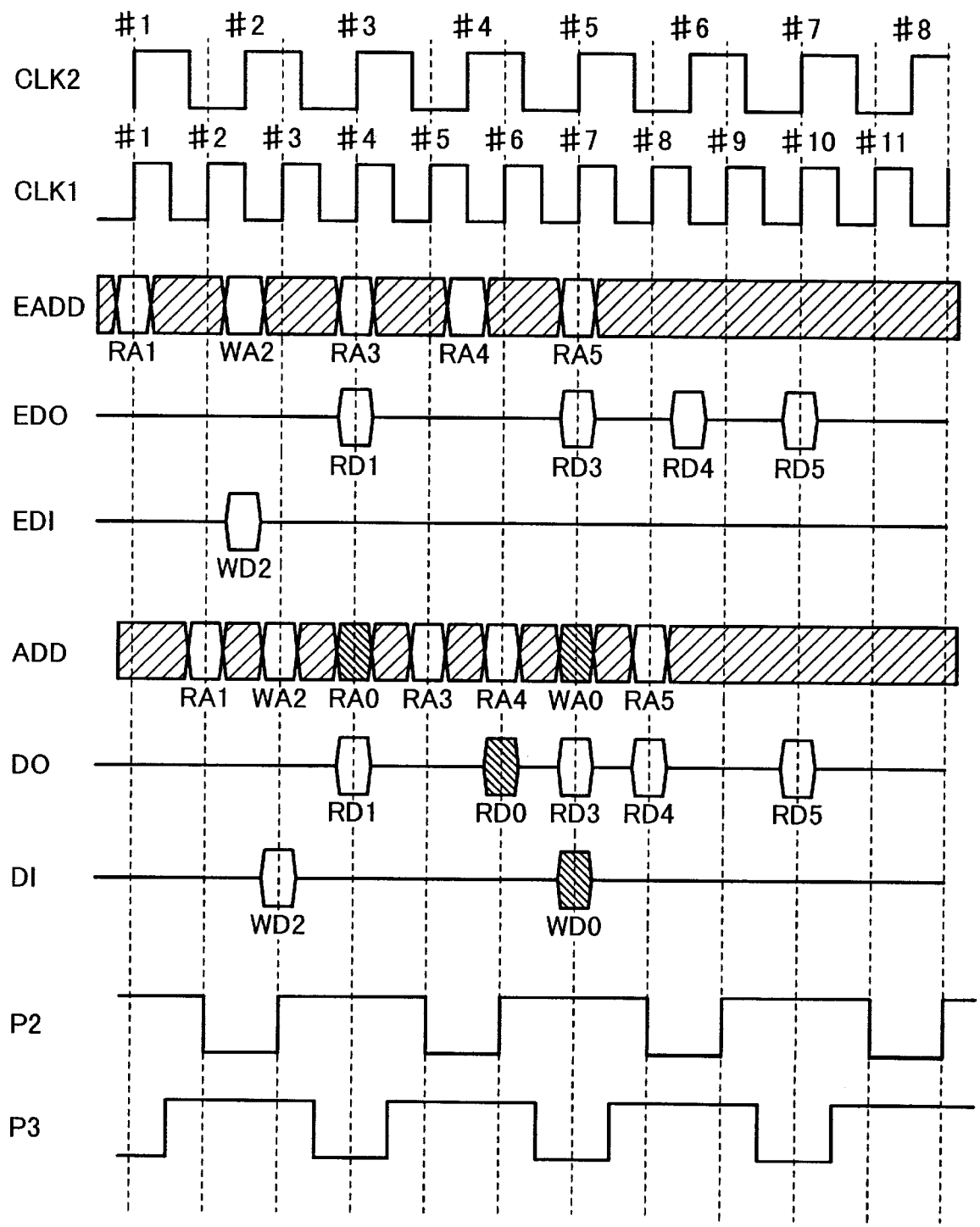
FIG. 13 is a timing chart for operation of the embodiment shown in FIG. 12.

FIGS. 12 and 13 show examples in which the frequency ratio of CLK1 to CLK2 is 3/2, in more detailed form. The example shown in FIG. 12 is different from that in FIG. 10 in the following two points. (1) In place of the circuit which creates flip-flop FF1 to generate select signal P1 for selectors ASEL, DISEL and WESEL in FIG. 10, a circuit composed of flip-flops FF2, FF3 and FF4 is used in FIG. 12; here P3 represents select signal for selectors ASEL, DISEL and WESEL. (2) EADD, EDI, EDO and EWE are connected to selector ASEL, selector DISEL, DO terminal of PDRAM, and selector WESEL through flip-flop FF5, flip-flop FF6, latch TL1 and flip-flop FF7, respectively. Here, in latch TL1, output Q follows the data inputted to D as far as clock input E is "H." As clock input E becomes "L," Q output is retained until clock input E becomes "H." Like the example in FIG. 10, refresh sequencer REFSEQ uses clock CLK1 and CLK2 inputted to RFPDRAM to control refresh address generator RFADDG and refresh data latch RFDATL, and P2 and P3 so that PDRAM is refreshed adequately. FIG. 13 is a timing chart for this operational sequence.

Clock CLK1 is a clock whose frequency is 1.5 times that of clock CLK2 and their phase relationship is shown in FIG. 13. External access requests are loaded at the timings of rise of CLK2 through flip-flops FF5, FF6 and FF7 in the same way as in FIG. 11. The select signal P3 for selectors ASEL, DISEL and WESEL has a waveform as shown in FIG. 13, so an external access request loaded at the timing of rise of CLK2 is put into the pipelined dynamic memory PDRAM at rise timings of CLK1 after that timing. Here, read request RA1, write request WA2, read request RA3, read request RA4, and read request RA5 are loaded as external access requests at #1, #2, #3, #4 and #5 of CLK2, respectively; and read request RA1, write request WA2, read request RA3, read request RA4 and read request RA5 are loaded into PDRAM at #2, #3, #5, #6 and #8 of CLK1, respectively. In response to these access requests, RFPDRAM makes fixed output of read data RD1 at #4 of CLK1, input of write data WD2 at #3, fixed output of read data RD3 at #7, fixed output of read data RD4 at #8, and fixed output of read data RD5 at #10. Each of the read data is outputted through latch TL1 where P2 clock shown in FIG. 13 has been inputted, when read data RD1, read data RD3, read data RD4 and read data RD5 are fixed for output at #3, #5, #6 and #7 of CLK2, respectively. Read data is outputted with a latency of 2 in terms of CLK2 frequency, or a latency of 3 in terms of CLK1 frequency, or no waiting time. Write data is outputted with a latency of 0.

As stated above, an external access request to the pipelined dynamic memory PDRAM is generated only twice every three cycles. In FIG. 13, external access requests are generated twice every three cycles only at the leading edges of CLK1, like #2, #3, #5, #6 and so on. As PDRAM is fully pipelined, a request for access to PDRAM can be made every cycle of CLK1. On the other hand, in case of the structure shown in FIG. 12 or 13, an external access request can be issued at most twice every three cycles of CLK1. The access control circuit ACCRL issues access requests for refreshing to PDRAM in the intervals between these access requests (unoccupied pipeline slots indicated as #4, #7 and so on of CLK1). This sequence is detailed next by reference to FIG. 13.

To prevent the data stored in the pipelined dynamic memory PDRAM from being erased, the access control circuit ACCRL issues refresh requests to PDRAM at regular time intervals. In FIG. 13, for the refresh address generated by the refresh address generator RFADDG, read request RA0 is issued at #4 of CLK1, and the corresponding read data RD0 is received at #6 of CLK1 and stored in the refresh data latch RFDATL. Then, at #7 of CLK1, write request WA0 is issued to the same address to which the read request has been made, so that the dataWD0 stored in refresh data latch RFDATL is written there. With the above sequence, rewriting of memory cells in PDRAM takes place. After that, refresh address generator RFADDG counts up the refresh address RFADD. This operational sequence is repeated at regular time intervals by the refresh sequencer REFSEQ so that all the memory cells in PDRAM are refreshed.

Like FIGS. 11 and 12, in the examples shown in FIGS. 12 and 13, refreshing operation unique to any dynamic memory in which the electric charge stored in the capacitance is used to memorize data, can be completely concealed from a device or circuit which uses the dynamic memory. Also, in terms of access speed (latencies in this case), the read latency is 3 in terms of CLK1 or 2 in terms of CLK2. The read latency is larger than PDRAM's original latency only by 1, so that refreshing operation can be completely concealed.

Alternatively, thanks to the feature that PDRAM is fully pipelined, read and write requests for refreshing can be repeatedly made in the intervals between external access requests. Other various refresh means which take advantage of the feature that PDRAM is fully pipelined are possible without disturbing external access requests. Combinations of different refresh means are acceptable. When an external access request and a refresh request collide, if the external access request may be delayed, it is apparent that more variations of refresh means are possible.

Embodiment 5

Figure 14:
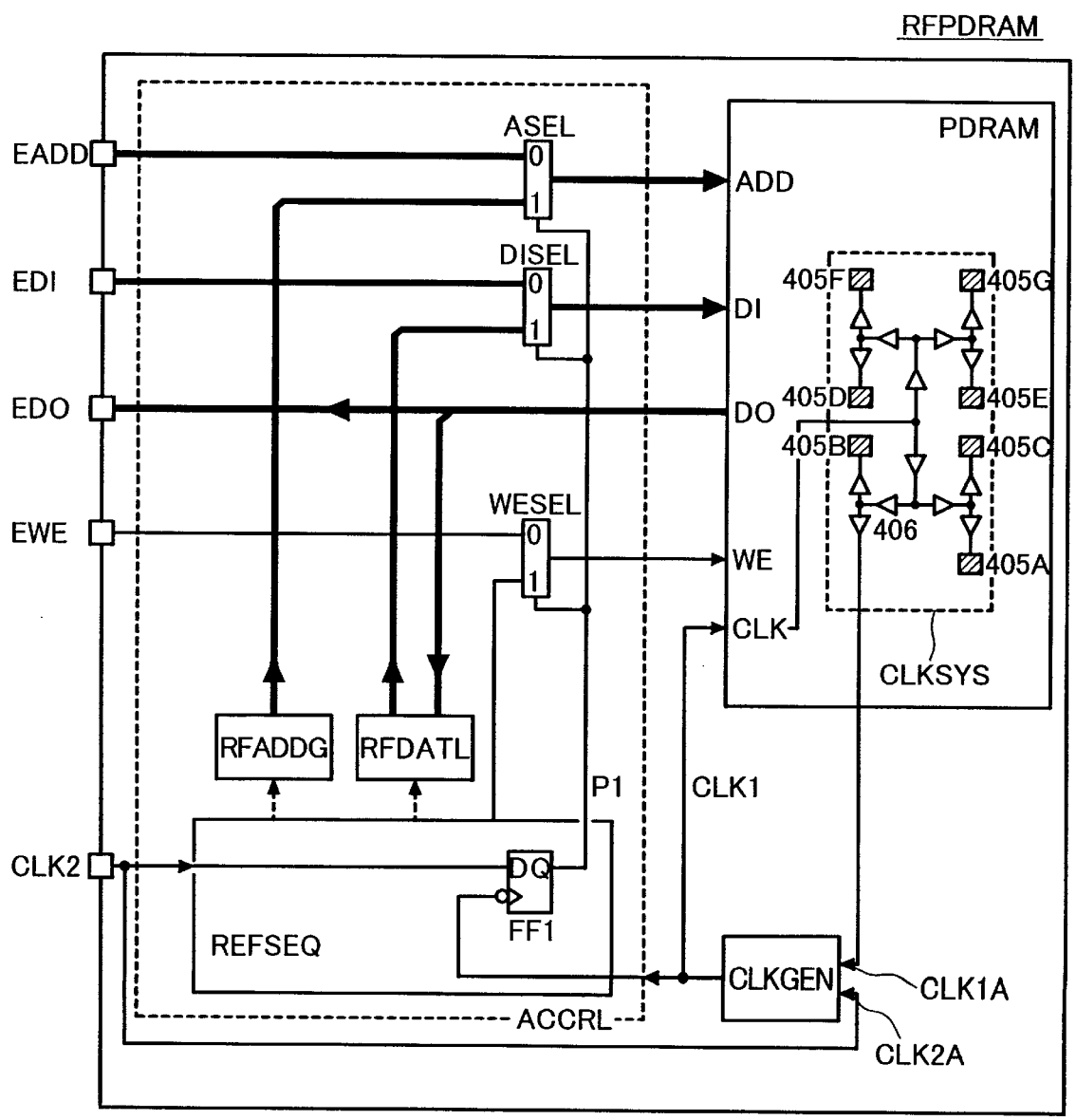
FIG. 14 illustrates an embodiment which has a clock generating circuit in addition to the embodiment shown in FIG. 10.

In the examples of refresh dynamic memory RFPDRAM shown in FIGS. 10 and 12, clocks CLK1 and CLK2 are inputted from outside; however, other clock sources maybe used. CLK2 may be generated from CLK1 by means of a clock divider or the like, or CLK1 may be generated from CLK2 by means of a clock doubler such as PLL (phase locked loop). FIG. 14 shows an example which has a PLL-based clock distribution in addition to the structure in FIG. 10. CLKGEN represents a clock generating circuit; in this case it is a clock doubler with a PLL structure. CLKSYS represents a clock distribution inside PDRAM; in this case it is an H-tree clock distribution though not limited so. In the figure, the triangles (e.g. 406) express clock buffers, which distribute CLK1 to the latch circuits 405A to 405G which use CLK1 with no skew (here circuits which use latches, flip-flops or clocks such as selectors are collectively referred to as latch circuits). CLK1 is also distributed to clock generating means 403 as CLK1A at the same timing (phase) as when it is distributed to latch circuits 405A to 405G. Besides, clock CLK2 is also supplied to the clock generating circuit CLKGEN. Since the clock generating circuit CLKGEN has a PLL structure, it includes a phase comparator circuit so that CLK1 is generated in a way that the following conditions are met: (1) The phases of CLK1A and CLK2A are the same; (2) The frequency of CLK1A is double that of CLK2.

As mentioned above, when, in PDRAM, CLK1 which is distributed using the clock distribution with no skew is fed back to the clock generating circuit as CLK1A with no skew, the phase of CLK2 supplied to RFPDRAM is the same as the phase of CLK1 which is received by latch circuits 405A to 405G. This makes it easy to obtain setup margins or hold margins for various signals such as ADD, EADD, DO, EDO, DI, EDI, WE and EWE, so PDRAM can be operated at higher frequencies. Particularly, the effect of the above method is significant for PDRAM whose area is large, because a considerable delay occurs between the clock at the output point of the clock generating circuit CLKGEN and the clock received by latch circuits 405A to 405AG.

The clock generating circuit shown in FIG. 14 may have any structure other than PLL. It may have a structure such as DLL (delay docked loop) or SMD (synchronous mirror delay). It may have any structure as far as clocks with desired frequencies can be generated by making the phases of two inputted clocks coincide. cl Embodiment 6

The refreshing process in the refresh concealing technique used in embodiments 3 and 4 can also be used for access to PDRAM for purposes other than refreshing. For example, it can be used for rewrite access with the pipeline rewrite technique shown in FIG. 8. Specifically, PDRAM may be used in a manner that the frequency of external access is smaller than the pipeline frequency which depends on the performance of PDRAM so that remaining time can be used for rewriting as mentioned above. Thus, a fully pipelined high-speed dynamic memory which uses destructive read memory cells can be realized without using the cache 110.

The number of pipeline stages and the pipeline partitioning method are not limited to those shown in FIG. 9 and those shown later in FIG. 15. One method of increasing the number of pipeline stages is to input clock CLK to word line decoder LX-DEC to add a latch function; another method is to use read amplifier RAMP or write amplifier WAMP as a pipeline latch. Needless to say, as the number of pipeline stages is increased, the pipeline pitch can be decreased to increase the operating frequency.

In the above-said examples of pipeline dynamic memory PDRAM, output data from memory cells are outputted to the outside of PDRAM through latches (hereinafter called output latches). In the example shown in FIG. 9, read data latch RDATL is provided as an output latch. However, the refresh concealing technique used in this invention may be embodied regardless of the presence of this output latch. It can be used for flow-through type synchronous dynamic memories. Naturally the latency varies according as whether there is an output latch or not.

It is also possible to add a delayed write function as used in FIG. 6 or FIG. 7 to the example in FIG. 9; even if that is the case, obviously the refresh concealing technique shown in FIGS. 10 to 14 according to this invention can be realized only by using a small circuit. By making the write latency and the read latency equal, plural access requests or refresh requests from plural bus masters of CPUs or the like can be fed to the dynamic memory without disturbing the pipeline. Unlike the example in FIG. 9 where output data lines DO and input data lines DI are separate lines, if input/output data lines serve as both output data lines DO and input data lines DI, input data and output data must be separated for time-sharing; in such a situation, the delayed write function is very effective. In so-called "read modify write access," after processing is done using the data which has been read, the data must be written; in such a situation, when the read latency is equal to the write latency, a higher pipeline fill rate is achievable.

Figure 2A:
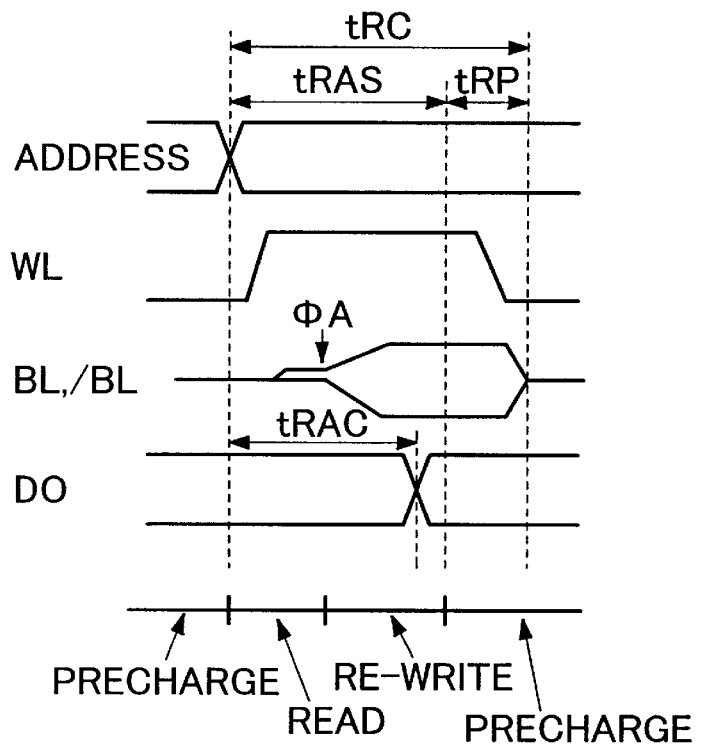
FIGS. 2A and 2B are graphs showing operating waveforms of a conventional dynamic memory.
Figure 2B:
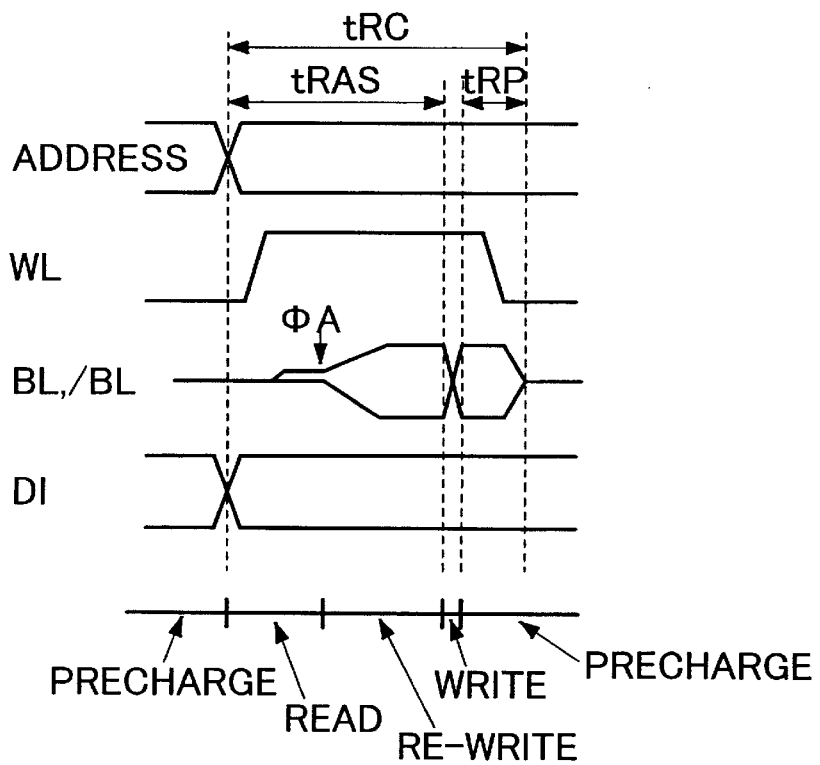

Obviously, even if it is not exactly the same type of pipelined dynamic memory PDRAM as illustrated in FIG. 9 etc, the above-said refresh concealing technique can be applied as far as it is a pipelined dynamic memory. PDRAM need not be of the non-rewritable type as shown in FIG. 3. For rewriting, the word line assert time is relatively long as shown in FIG. 2, and thus the pipeline pitch must be longer, which makes it difficult to increase the pipeline frequency. However, the refresh data latch RFDATL in FIGS. 10 and 12 is not needed and the refresh sequencer REFSEQ has only to issue read access requests to addresses generated by the refresh address generator RFADDG.

Although the refresh concealing technique mentioned above uses pipeline operation, it can be used even in a non-pipelined dynamic memory, for instance, a synchronous dynamic memory (SDRAM). (Though even SDRAMs are pipelined with regard to column access, the term "pipelining" used in this application means pipelining associated with row access.) Concretely, when the external cycle time is set to a value larger than the cycle time which depends on the circuit performance, remaining time can be used for refreshing. For instance, it is a good idea to make SDRAM's external access request cycle time double that of the access cycle time which can be basically executed by SDRAM. This can be achieved by making the time interval (tRC= tRAS+tRP) between bank active commands to the same bank double the level executable by the circuit. This means that if that time interval (2×tRC) is used, precharge commands can be executed by two bank active commands. One of the precharge commands by the two bank active commands should be used to process an external access request, while the other precharge command should be used for refreshing operation as necessary. Due to the non-pipelined structure, the cycle time doubles, and the latency also virtually doubles if a delay in external access which occurs during refreshing operation as mentioned above is included. This type of dynamic memory is relatively low in performance; however, because it can completely conceal refreshing operation, it performs external control easily and thus is easy to handle.

Embodiment 7

In the example shown in FIG. 9, memory cells which each consist of an n-MOS transistor and a capacitor are used to memorize data. In short, it is assumed to use destructive read memory cells (hereinafter called 1T memory cells) in which the data inside them is destroyed as it is read out. The memory cells used in this invention are not limited to this type. The invention can be applied to dynamic memories which use non-destructive read memory cells (hereinafter called 3T memory cells) each consisting of three n-MOS transistors as stated on pages 42–43 of 1970 IEEE International Solid-State Circuits Conference Digest of Technical Papers. Many other variations of dynamic memory cells such as ones which use four MOS transistors may be used. In case of using 3T memory cells, read word lines and write word lines may be either separate lines or common lines, or read bit lines and write bit lines may be either separate lines or common lines. The structure and control method of these memory cells are also not limited.

Figure 15:
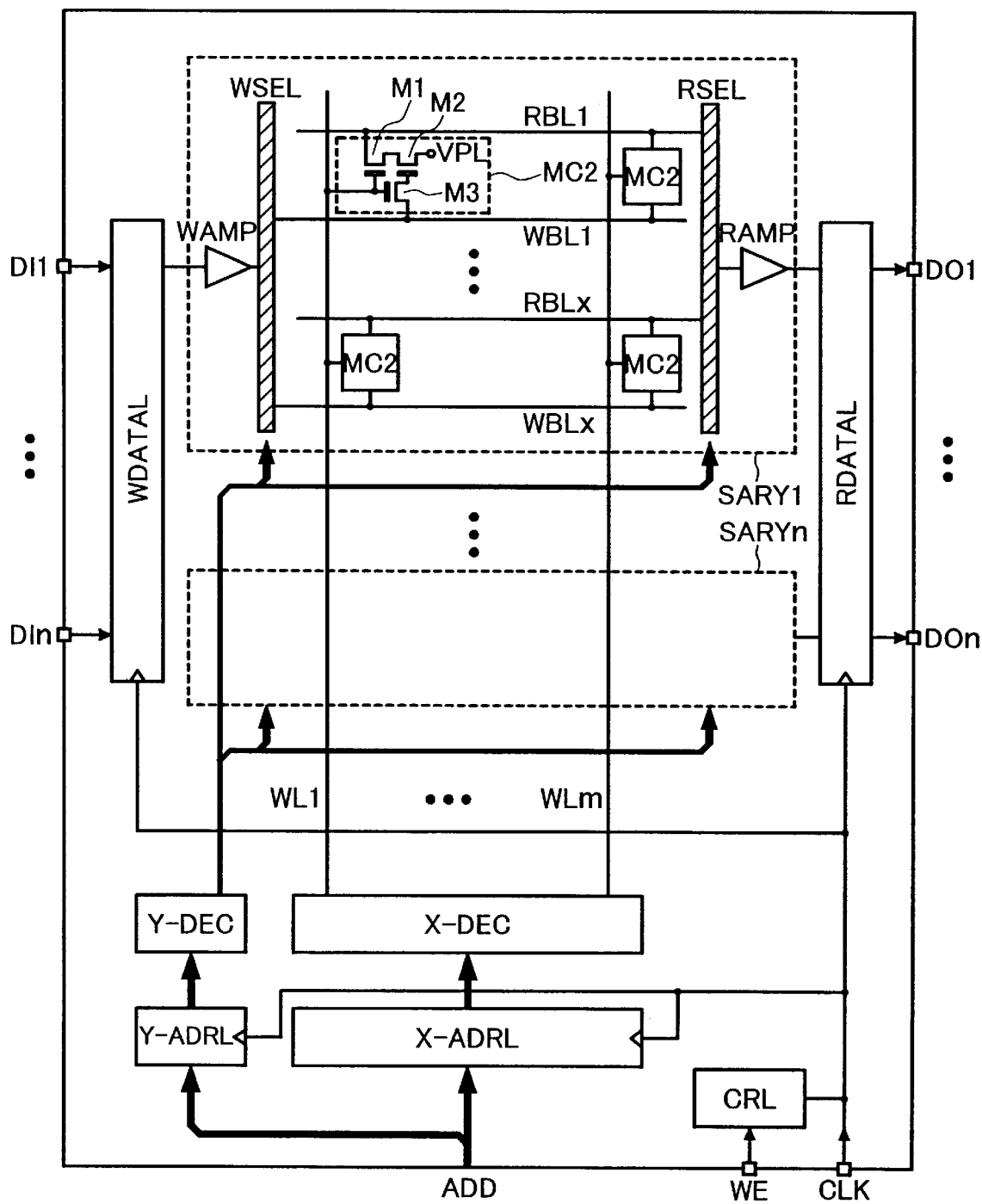
FIG. 15 illustrates an embodiment of a pipelined dynamic memory which uses 3T memory cells.

FIG. 15 shows an example of a pipelined dynamic memory PDRAM which uses 3T memory cells. MC2 represents a 3T memory cell. Data is memorized by the electric charge stored in the gate terminal of n-MOS transistor M2. Word lines WL1 to WLm and global word lines GWL1 to GWLz are controlled according to ternary data. At medium potential, the current which depends on the potential of the gate of n-MOS transistor M2 is fed to bit line RBL through n-MOS transistor M1 for reading. For writing, high voltage is applied to word line WL to turn on n-MOS transistor M3, and voltage from bit line WBL is directly applied to the gate potential of n-MOS transistor M2.

The example in FIG. 15 is different from that in FIG. 9 in the following two points. One point is that while in FIG. 9 the memory cells are 1T memory cells, in FIG. 15 the memory cells are 3T memory cells and, therefore, two types of bit lines—read bit lines RBL1 to RBLX and write bit lines WBL1 to WBLx—are used. The second point is as follows. In FIG. 9, write data is amplified by write amplifier WAMP after passing through write data selector WSEL, and then sent to the bit lines, and the read data on the bit lines is amplified by a read amplifier before being outputted through read data selector RSEL. On the other hand, in FIG. 15, write data is amplified by write amplifier WAMP before being sent to the bit lines through write data selector WSEL, the read data on the bit lines is passed through read data selector RSEL and then amplifiedby read amplifierbefore being outputted. Thus, one read amplifier RAMP or write amplifier WAMP is shared by more than one Y address. The read amplifier RAMP and the write amplifier WAMP are shared by plural bit lines as shown in FIG. 15. This sharing of the read amplifier RAMP or the write amplifier WAMP offers an advantage that the area available for each amplifier can be larger than when they are not shared. A larger area for each amplifier gives more latitude of choice of amplifier types, which implies that the use of a higher speed amplifier such as a current sense amplifier is possible.

If 3T memory cells which have read word lines and write word lines like 10(a) in FIG. 1 on page 13 of the book about VLSI memories by Kiyoo Itoh (published by Baifukan in 1994) are used, the hierarchical arrangement of read word lines as shown in FIG. 15 is no longer needed. This is because 3T memory cells are non-destructive read cells and thus it is allowed that memory cells are not read out even after word line assertion.

Like FIG. 9, FIG. 15 does not illustrate any concrete circuits for WAMP and RAMP. The arrangement of RAMP, WAMP and bit lines is not limited to that shown in FIG. 15. In FIG. 15, WAMP and RAMP are located at both ends of the bit lines in order to make the illustration easy to understand. The actual circuit layout is not limited to this layout. WAMP and RAMP may be located at one end of the bit lines like 303 and 302 in FIG. 4. In that case, it is needless to say that write data selector WSEL and read data selector RSEL may be shared depending on the layout. Further, a so-called "shared sense amplifier" system may be used by connecting bit lines to both ends of RAMP and WAMP and connecting memory cells to the respective bit lines. Besides, no precharge circuit like 301 in FIG. 4 is not shown in FIG. 15 for purposes of better illustration, but obviously any circuits necessary for memory circuit operation, such as precharge circuits, may be added in adequate places.

Even when non-destructive read memory cells like the 3T memory cells shown in FIG. 15 are used in the pipelined dynamic memory PDRAM according to this invention, tRAS shown in FIG. 3A is not needed and thus a short reading operation as expressed by tRP can be achieved. This offers an advantage that the cache memory 110 is not needed. Evidently, with 3T memory cells, pipeline operation according to this invention, as shown in FIGS. 5 to 14, can be performed in the same way as when 1T memory cells are used.

Depending on the supply voltage, if a capacitor which complicates the process is not added to the storage node of a 3T memory cell (gate terminal of n-MOS transistor M2), the retention time is shorter than when 1T memory cells are used. Also, since rewriting is not done during reading, the actual retention time is shortened. In addition to the above factors, 3T memory cells which use logic processes have more factors which shorten the retention time, than 1T memory cells. As the retention time decreases, the frequency of refreshing increases. However, this disadvantage can be compensated for by using the aforementioned refresh concealing technique according to this invention or a similar technique to reduce refresh-related overhead.

Figure 16:
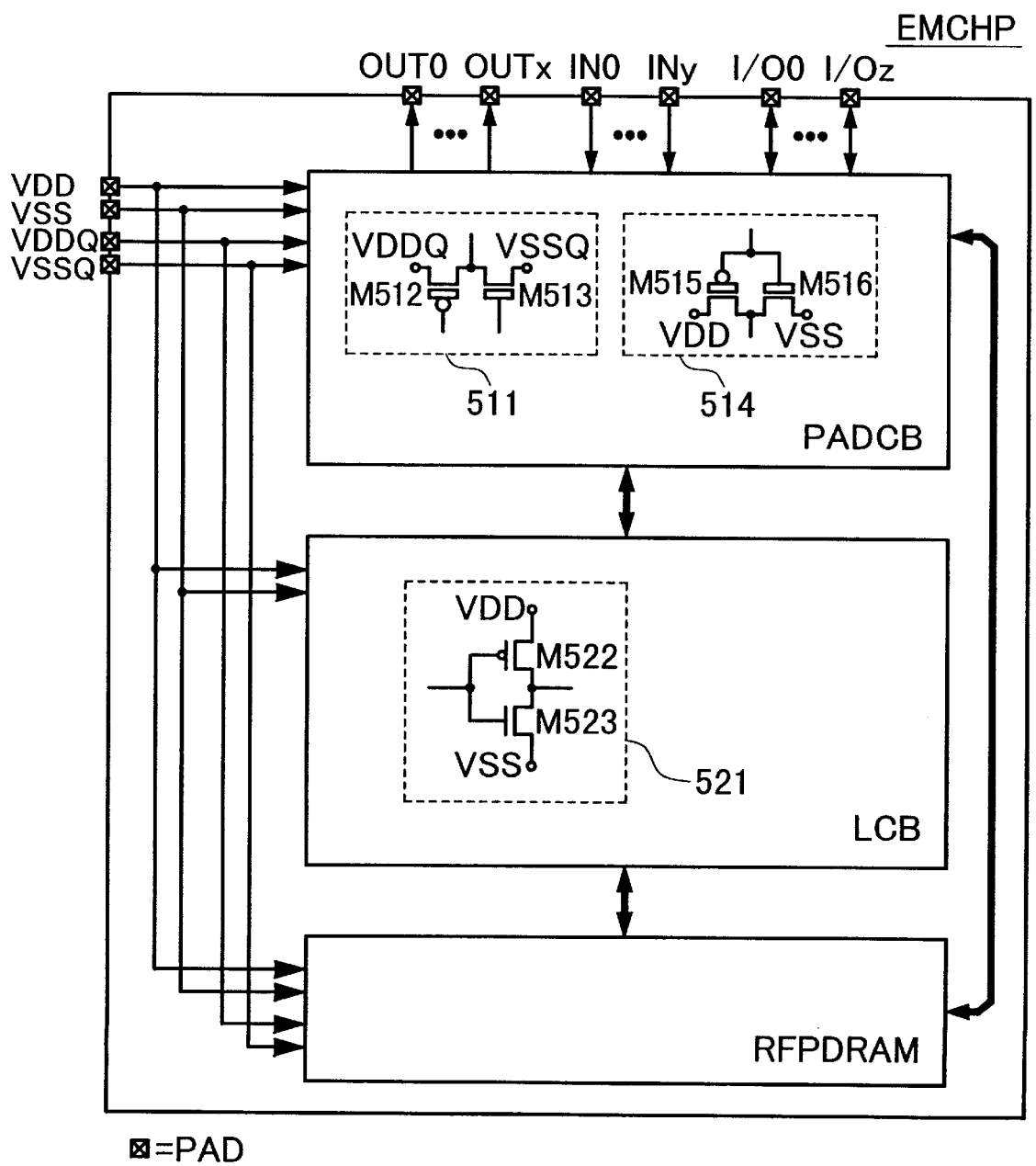
FIG. 16 illustrates an embodiment of a merged DRAM/logic LSI which uses a refresh-free dynamic memory according to this invention.

FIG. 16 shows an example of a merged DRAM/logic LSI (EMCHP) which incorporates a refresh-free dynamic memory RFPDRAM according to this invention. Here, 3T memory cells as shown in FIG. 15 are used as memory cells. Regarding MOS symbols used in FIG. 16, a part with a gate electrode as expressed by a box with a white inside area (e.g. M512) denotes a high voltage MOS transistor which has a larger gate-oxide thickness (e.g. 6.5 nm), while a part with a gate electrode as expressed by a line (e.g. M522) denotes a MOS transistor which has a smaller gate-oxide thickness (e.g. 3.2 nm).

VDD and VSS represent a core power supply and its earth, VDDQ and VSSQ represent an I/O power supply and its earth. For instance, the core power supply voltage is 1.0 V and the I/O power supply voltage is 3.3 V. OUT0 to OUTx represent output signals, IN0 to INy input signals, I/O0 to I/Oz input/output signals. PADCB shows an I/O circuit for interfacing chip inside signals with the outside of the chip, and 511 shows a final driver circuit which is composed of a p-MOS transistor M512 and an n-MOS transistor M513 which have a thick gate-oxide thickness. Numeral 514 represents an initial buffer circuit which is composed of a p-MOS transistor M515 and an n-MOS transistor M516 which have a thick gate-oxide thickness. (It is advisable to use MOS transistors with a thick gate-oxide thickness as MOS transistors in an ESD device to prevent electrostatic destruction, though such a device is not shown here to illustrate 514 in a simplified form.) LCB shows a logic circuit which incorporates inverters and NAND gates. FIG. 16 shows an inverter circuit 521 which incorporates p-MOS transistor M522 and n-MOS transistor M523 which have a thin gate-oxide thickness. Examples of LCB are a logic circuit with more than 10,000 gates like a microprocessor or DSP, and SRAM. The 3T memory cells in RFPDRAM use the same MOS transistors as the thick-gate-oxide MOS transistors used in the I/O circuits. (Since high voltage maybe applied ton-MOS transistors M1 and M3 in MC in FIG. 15, the transistors should be thick-gate-oxide MOSs. However, since high voltage is not applied to M2, thin-gate-oxide MOS transistors may be used depending on the process and memory cell size.)

In the example shown in FIG. 16, MOS transistors in which high voltage might be applied between the gate and source electrodes or between the gate and drain electrodes are thick-gate-oxide MOSs, and other MOS transistors are thin-gate-oxide MOSs for higher speed processing. If, like the example in FIG. 6, only two types of gate oxide thickness are used throughout the chip, the fabrication process can be simplified.

Generally speaking, if a dynamic memory based on 1T memory cells and a logic LSI are integrated on a chip, the chip fabrication process would be more complicated. However, if a dynamic memory uses 3T memory cells, memory cells need not incorporate a capacitor; therefore, the fabrication process would be less complicated than when 1T memory cells are used. In addition, if the arrangement shown in FIG. 16 is used, the same type of transistors as those used in logic LSIs and I/O circuits can be used for the transistors used in the memory cells. (However, to ensure both high speed processing and high retention time in memory cells, it is acceptable that the transistors in 3T memory cells do not have a silicide diffusion layer and the other transistors have a silicide diffusion layer for low diffusion layer resistance.) When a logic LSI and a dynamic memory are integrated on a chip in this way, the complexity of the fabrication process will be drastically decreased.

The major effects of the above embodiments are as follows.

(1) Since a destructive read type dynamic memory is used, data on bit lines need not be amplified and time correspondent to tRAS is not required. Further, as the amplitude for the bit lines is small, precharge time is short.

(2) As a result of (1), cycle time tRC can be much shorter than in conventional dynamic memories. Taking full advantage of this feature, the pipeline pitch can be decreased by pipelining the dynamic memory like a pipelined SRAM.

(3) If a sense amplifier based on the direct sensing scheme is used in the dynamic memory, quicker amplification is possible. In conventional dynamic memories, if a sense amplifier based on the direct sensing scheme should be used, it would be necessary to install an additional amplifier for rewriting into memory cells in parallel with it. The dynamic memory according to this invention does not require such an additional amplifier, which means a reduction in chip area.

(4) With the above-mentioned configuration, the read latency and write latency in a pipelined dynamic memory can be identical. This can increase the pipeline fill rate in case both read and write access requests exist.

(5) The dynamic memory's refresh operation can be concealed by pipelining the dynamic memory and adding an access control circuit ACCRL externally.

(6) When 3T memory cells are used, the above effects can be obtained without using any cache 110.

According to major aspects of this invention, the read and write cycle times for dynamic memory cells can be shortened to realize a higher speed DRAM.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A semiconductor device comprising:
   a memory circuit including a plurality of memory cells provided at intersections of a bit line and a plurality of word lines, a row decoder coupled to the plurality of word lines, and a row address latch circuit for latching a row address at a transition point of a first clock with a predetermined cycle and supplying it to said row decoder; and
   an access control circuit which receives an external address supplied to a plurality of first nodes at a predetermined timing of a second clock supplied to a second node, and supplies the external address at the timing of the first clock to the row address latch circuit,
   wherein the cycle of the first clock is shorter than that of the second clock.

2. The semiconductor device according to claim 1, wherein
   the memory circuit further includes:

a read circuit for amplifying the stored signal read to the bit line from one of the plurality of memory cells and outputting it to a third node;

a write circuit for writing data inputted to a fourth node, as memory data, into one of the plurality of memory cells via the bit line; and a data latch circuit connected between the third and fourth nodes, wherein the access control circuit further includes a refresh control circuit by which a first word line is selected for a predetermined time period from a first transition point of the first clock, first data read from a first memory is read by the read circuit and held by the data latch circuit, hereinafter the first word line is selected for a predetermined time period from a second transition point of the first clock after the first transition point and the first data held by the data latch circuit is written back to the first memory cell via the write circuit and the bit line in order to refresh the memory data in the first memory cell, the first word line is one of the plurality of word lines, and the first memory cell is one of the plurality of memory cells connected with the first word line.

3. The semiconductor device according to claim 1, wherein the access control circuit further includes a refresh control circuit which supplies a first row address for reading first data from a first memory cell, one of the plurality of memory cells, to the address latch circuit at one transition point of the first clock at which the external address is not supplied, and then supplies the first row address for writing the first data into the first memory cell, to the address latch circuit at another transition point of the first clock at which the external address is not supplied.

4. The semiconductor device according to claim 3, wherein the frequency of the second clock is half that of the first clock.

5. The semiconductor device according to claim 4, wherein the refresh control circuit receives the external address at a rising edge of the second clock, supplies the external address to the row address latch circuit at a rising edge of the first clock corresponding to that of the second clock, and then supplies the first row address for refreshing to the row address latch circuit, at a rising edge of the first clock corresponding to a falling edge of the second clock, without receiving the external address at the falling edge of the second clock.

6. The semiconductor device according to claim 1, wherein the access control circuit further includes a clock generating circuit which receives the second clock and generates the first clock, the memory circuit further has a clock distribution circuit which distributes the first clock into the memory circuit, and the clock generating circuit further has a phase comparator which compares the phase of the second clock with that of the first clock distributed and fed back via the clock distribution circuit.

7. The semiconductor device according to claim 1, wherein each of the plurality of memory cells has a MISFET whose gate is connected to a corresponding word line and whose source or drain is connected with the bit line, and a capacitor connected with remaining one of the source or drain of the MISFET, wherein data is stored by the electric charge stored in the capacitor.

8. The semiconductor device according to claim 1, wherein each of the plurality of memory cells is a non-destructive read memory cell.

9. The semiconductor device according to claim 1, wherein the bit line is divided into a first bit line for reading and a second bit line for writing, each of the plurality of memory cells has a first MISFET whose gate is connected to a corresponding word line and whose source or drain is connected with the first bit line, a second MISFET whose source or drain is connected with the remaining one of the source or drain of the first MISFET, and a third MISFET whose gate is connected with the corresponding word line and whose source or drain is connected with the gate of the second MISFET.

10. The semiconductor device according to claim 1, further comprising an output circuit with a first MISFET for outputting signals within the semiconductor device to the outside of it, and a logical gate circuit with a second MISFET, wherein each of the plurality of memory cells has a third MISFET, and wherein the gate-oxide thickness of the third MISFET is the same as that of the first MISFET and larger than that of the second MISFET.

11. The semiconductor device according to claim 1, further comprising an input circuit with a first MISFET for inputting signals from the outside of the semiconductor device into it and a logical gate circuit with a second MISFET, wherein each of the plurality of memory cells has a third MISFET, and wherein the gate-oxide thickness of the third MISFET is the same as that of the first MISFET and larger than that of the second MISFET.

12. A semiconductor device comprising:

a plurality of memory cells provided at intersections of a bit line and a plurality of word lines;

a read circuit for amplifying a signal read to the bit line from one of the plurality of memory cells and outputting it to a first node;

a write circuit for writing data inputted to a second node, as a memory data, into one of the plurality of memory cells via the bit line;

a data latch circuit connected between the first and second nodes; and a refresh control circuit by which a first word line is selected for a predetermined time period from a first transition point of a predetermined clock, first data read from a first memory cell is read by the read circuit and held by the data latch circuit, hereinafter the first word line is selected for a predetermined time period from a second transition point of the predetermined clock after the first transition point, and the first memory data held by the data latch circuit is written back to the first memory cell via the write circuit and the bit line in order to refresh the data in the first memory cell, the first word line is one of the plurality of word lines, and the first memory cell is one of the plurality of memory cells connected with the first word line.

13. The semiconductor device according to claim 12, wherein each of the plurality of memory cells has a MISFET whose gate is connected with a corresponding word line and whose source or drain is connected with the bit line, and a capacitor connected with the remaining one of the source or drain of the MISFET, wherein data is stored by the electric charge stored in the capacitor.

14. The semiconductor device according to claim 12, wherein each of the plurality of memory cells is a non-destructive read memory cell.

15. The semiconductor device according to claim 12, wherein the bit line is divided into a first bit line for reading and a second bit line for writing, wherein each of the plurality of memory cells has a first MISFET whose gate is connected with a corresponding word line and whose source or drain is connected with the first bit line, a second MISFET whose source or drain is connected with the remaining one of the source or drain of the first MISFET, and a third MISFET whose gate is connected with the corresponding word line and whose source or drain is connected with the gate of the second MISFET.

16. A semiconductor device comprising:

a memory circuit which includes a plurality of memory cells provided at intersections of a plurality of bit lines and a plurality of word lines; and an access control circuit which receives an external address and a plurality of external commands indicating reading or writing at a transition point of a first clock, and supplies them to the memory circuit as an internal command and an internal address at a transition point of a second clock whose frequency is higher than that of the first clock, wherein the access control circuit further has a refresh control circuit which refreshes the plurality of memory cells at a transition point of the second clock whose timing does not allow the external command and external address to be supplied.

17. The semiconductor device according to claim 16, wherein the frequency ratio of the first clock to the second clock is a rational number.

18. The semiconductor device according to claim 16, wherein the external address is signals for selecting one of the plurality of memory cells.

* * * * *